(12) United States Patent
Takenaga et al.

(10) Patent No.: US 7,508,203 B2
(45) Date of Patent: *Mar. 24, 2009

(54) MAGNETIC FIELD DETECTOR, AND CURRENT DETECTION DEVICE, POSITION DETECTION DEVICE AND ROTATION DETECTION DEVICES USING THE MAGNETIC FIELD DETECTOR

(75) Inventors: Takashi Takenaga, Chiyoda-ku (JP); Hiroshi Kobayashi, Chiyoda-ku (JP); Takeharu Kuroiwa, Chiyoda-ku (JP); Sadeh Beysen, Chiyoda-ku (JP); Taisuke Furukawa, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/098,291

(22) Filed: Apr. 4, 2008

(65) Prior Publication Data
US 2008/0186635 A1 Aug. 7, 2008

Related U.S. Application Data

(63) Continuation of application No. 10/589,246, filed as application No. PCT/JP2004/013824 on Sep. 22, 2004, now Pat. No. 7,375,516.

(30) Foreign Application Priority Data
Feb. 19, 2004 (JP) .............................. 2004-043248

(51) Int. Cl.
*G01R 33/09* (2006.01)
*G01R 33/05* (2006.01)
*G01B 7/30* (2006.01)

(52) U.S. Cl. ............. 324/252; 324/207.21; 324/207.25; 324/249

(58) Field of Classification Search ............ 324/207.11, 324/207.21, 207.25, 244, 249, 252, 260; 73/514.31, 514.39; 338/32 R, 32 H
See application file for complete search history.

(56) References Cited

U.S. PATENT DOCUMENTS 5,561,368 A * 10/1996 Dovek et al. ................. 324/252

(Continued)

FOREIGN PATENT DOCUMENTS

JP  8 226960  9/1996

(Continued)

*Primary Examiner*—Bot LeDynh
(74) *Attorney, Agent, or Firm*—Oblon, Spivak, McClelland, Maier & Neustadt, P.C.

(57) ABSTRACT

A magnetic field detector having a reference magnetoresistive element and a magnetic field detecting magnetoresistive element. The reference magnetoresistive element and the magnetic field detecting magnetoresistive element each has a stack structure including an antiferromagnetic layer, a fixed layer of a ferromagnetic material with the direction of magnetization fixed by the antiferromagnetic layer, a nonmagnetic layer, and a free layer of a ferromagnetic material with the direction of magnetization adapted to be changed by an external magnetic field. The reference magnetoresistive element is such that the direction of magnetization of the fixed layer and the direction of magnetization of the free layer in the nonmagnetic field are parallel or antiparallel to each other, and the magnetic field detecting magnetoresistive element is such that the direction of magnetization of the fixed layer and the direction of magnetization of the free layer in the nonmagnetic field are different from each other. Thus, it is possible to provide a magnetic field detector capable of singly calibrating the sensitivity and the resolution of the detector whenever required.

13 Claims, 13 Drawing Sheets

U.S. PATENT DOCUMENTS

| | | |
|---|---|---|
| 6,580,270 B1 * | 6/2003 | Coehoorn .................. 324/252 |
| 7,023,206 B2 | 4/2006 | Viehland et al. |
| 2007/0047152 A1 | 3/2007 | Furukawa et al. |

FOREIGN PATENT DOCUMENTS

| | | |
|---|---|---|
| JP | 2000 180207 | 6/2000 |
| JP | 2001 217484 | 8/2001 |

* cited by examiner

MAGNETIC FIELD DETECTOR, AND CURRENT DETECTION DEVICE, POSITION DETECTION DEVICE AND ROTATION DETECTION DEVICES USING THE MAGNETIC FIELD DETECTOR

CROSS REFERENCE TO RELATED APPLICATIONS AND INCORPORATION BY REFERENCE

This application is a continuation of and claims the benefit of priority under 35 USC §120 from U.S. Ser. No. 10/589,246, filed Aug. 14, 2006, now U.S. Pat. No. 7,375,516, the entire content of which is incorporated herein by reference, which is the National Stage of PCT/JP04/13824, filed Sep. 22, 2004, and is based upon and claims the benefit of priority under 35 USC §119 from the Japanese Patent Applications No. 2004-043248, filed Feb. 19, 2004.

TECHNICAL FIELD

The present invention relates to a magnetic field detector for detecting the magnetic field by the giant magnetoresistance effect or the tunnel magnetoresistance effect, and a current detection device, a position detection device and a rotation detection device using the magnetic field detector.

BACKGROUND ART

The magnetoresistance (MR) effect is a phenomenon in which the electrical resistance is changed by application of a magnetic field to a ferromagnetic material, and used for the magnetic field detector and the magnetic head. In recent years, an artificial lattice film such as Fe/Cr, Co/Cu has been come to be known as a giant magnetoresistance (GMR) effect material exhibiting a very large magnetoresistance effect.

Also, what is called a spin valve film having a structure including a ferromagnetic layer, a nonmagnetic layer, a ferromagnetic layer and an antiferromagnetic layer is known, in which the nonmagnetic metal layer has such a thickness as to substantially eliminate the switched connection function between the ferromagnetic layers, and in which the magnetic moment of the ferromagnetic layer adjacent to the antiferromagnetic layer is fixed as what is called a fixed layer by the switched connection between the particular ferromagnetic layer and the antiferromagnetic layer while only the spin of the other ferromagnetic layer constitutes a free layer easily inverted by an external magnetic field. The antiferromagnetic material is formed of FeMn, IrMn, PtMn or the like. In this case, the switched connection between the two ferromagnetic layers is so weak that the spin can be inverted in a weak, small magnetic field. Thus, a highly sensitive magnetoresistive element can be provided and used as a high-density magnetic recording and read head. The spin valve film described above is used by supplying a current inward of the film surface.

On the other hand, it is known that a still larger magnetoresistance effect can be produced utilizing the vertical magnetoresistance effect for supplying a current in the direction perpendicular to the film surface.

Further, a tunneling magnetoresistance (TMR) effect due to the ferromagnetic tunnel coupling is known which utilizes the fact that the magnitude of the tunneling current in the direction perpendicular to the film surface is differentiated by arranging the spins of the two ferromagnetic layers in parallel or antiparallel to each other with an external magnetic field in a three-layer film of a ferromagnetic film, an insulating film and a ferromagnetic film.

In recent years, the use of the GMR or TMR element as a magnetic field detector has also been studied. In this connection, the magnetoresistive element of pseudo spin valve type with a nonmagnetic metal layer sandwiched by two ferromagnetic layers of different coercive forces and the magnetoresistive element of spin valve type described above are studied. In an application as a magnetic detector, the resistance value is changed by changing the relative angles of these two ferromagnetic layers making up each element in response to an external magnetic field. This change in resistance value is detected by reading a voltage change signal while supplying a constant current. The reading process is executed using the GMR or TMR effect.

The magnetoresistance change of the GMR element is smaller than that of the TMR element, and in order to obtain a large change rate, a stack structure of repetitive sets of a ferromagnetic layer and a nonmagnetic layer is required. Also, the GMR element, in which a current is supplied in the direction perpendicular to the film surface, is not required to be lengthened. Since the GMR element is smaller in resistance than the TMR element, however, the current amount is required to be increased to produce a large output signal. As a result, the power consumption is increased. Further, in the GMR element in which the current is supplied in the direction inward of the film surface as described above, a sufficient current path is required in the element and therefore the length of the element is required to be increased in order to produce a large magnetoresistance effect.

For the reason described above, the magnetic field detector desirably uses the TMR element which can produce a large output signal and can be provided in an arbitrary shape.

Further, a technique has been proposed in which a single magnetoresistive element is not used for measurement, but a bridge circuit is formed using four magnetoresistive elements, and elements with the fixed layers having opposite directions of magnetization are combined to form a high-output magnetic field detector (see Japanese Patent No. 3017061).

Patent Document 1: Japanese Patent No. 3017061

DISCLOSURE OF THE INVENTION

Problems to be Solved by the Invention

The use of the magnetoresistive element described above makes it possible to measure the external magnetic field based on the voltage change of the magnetoresistive element. Also, by use of the technique of the bridge circuit described above, a large output signal can be produced.

The saturation magnetic field of the free layer, however, is dependent on the thickness and shape of the free layer, and therefore liable to be affected by the variations due to reproducibility in the fabrication process, resulting in variations from one detector to another. As described above, the TMR element is desirably used as a magnetoresistive element. In this case, however, the element resistance is sensitive to the thickness of the tunnel insulating layer, and therefore is liable to be affected by the variations due to the reproducibility in the fabrication process, resulting in the variation from one detector to another. In the case where the resistance change rate and the saturation magnetic field change, therefore, an error occurs of the magnetic field detected in accordance with the particular change amount. Further, the resistance change rate and the saturation magnetic field also change with the operating temperature. As a result, the sensitivity and resolution of the detector are changed.

In the prior art, in order to calibrate them, the output signal and the saturation magnetic field for each detector are required to be measured by applying a magnetic field using a magnetic field generator. Also, in order to calibrate the change in the element characteristic with temperature, the measurement described above is required to be conducted for each temperature to calibrate the output signal.

In the conventional magnetic field detector, however, the variations in detection sensitivity and resolution cannot be easily detected and calibrated, and to carry it out, a giant magnetic field generator is required to generate a known external magnetic field.

Accordingly, it is an object of the present invention to provide a magnetic field detector and detection method and a physical amount measurement device using the detector and the detection method, in which the sensitivity and the resolution of the detector can be calibrated whenever required with a single detector.

Means for Solving the Problems

According to the present invention, there is provided a magnetic field detector including a reference magnetoresistive element and a magnetic field detecting magnetoresistive element, characterized in that the reference magnetoresistive element and the magnetic field detecting magnetoresistive element each have a stack structure including a fixed layer formed of an antiferromagnetic layer and a ferromagnetic material with the direction of magnetization thereof fixed by the antiferromagnetic layer on the one hand and a free layer formed of a nonmagnetic layer and a ferromagnetic material with the direction of magnetization thereof changed by an external magnetic field on the other hand, the reference magnetoresistive element is such that the direction of magnetization of the fixed layer is parallel or antiparallel to that of the free layer in the nonmagnetic field, and the magnetic field detecting magnetoresistive element is such that the direction of magnetization of the fixed layer and the direction of magnetization of the free layer in the nonmagnetic field are different from each other.

EFFECTS OF THE INVENTION

In the magnetic field detector described above, the resistance change rate can be calibrated at any time without using the magnetic field generator. Also, by referring to a magnetoresistive element having the magnetic field response in the nonmagnetic field while an external magnetic field is applied thereto, output signals can be compared within the same detector, so that even in the case where the element sensitivity changes, a stable output signal can be produced.

DESCRIPTION OF THE REFERENCE SIGNS 1, 41 Detection element; 2, 12, 22, 32 Direction of magnetization of second ferromagnetic layer in nonmagnetic field; 2a, 32a Direction of magnetization of second ferromagnetic layer with magnetic field applied; 3, 13, 23, 33 Direction of magnetization of first ferromagnetic layer; 4, 7, 8, 14, 16, 24, 26, 34, 36, 44, 77, 88, 110 Metal wires; 5 Magnetic shield; 6 Metal wire for application of magnetic field; 11, 21, 51 Reference element; 31 Saturation magnetic field detection element; 52 Magnetoresistive element; 61 Substrate; 62, 67 Wiring layer; 63 Antiferromagnetic layer; 64 First ferromagnetic layer; 65 Nonmagnetic layer; 66 Second ferromagnetic layer; 100 Object to be measured; 102 Wire; 103, 104 Magnet; 105 Gear; 106 Gear teeth; 109 Peripheral circuit around element; 110 Wire; 201 Resistance-voltage conversion circuit; 202 Add-subtract amplifier circuit; 203 Multiply-divide circuit; 204 Constant current source; 205 Add circuit; 206 Subtract circuit; 207 Differential amplifier circuit; 208, 209 Constant voltage source; 210 Output regulation circuit; 211 Calibration element; 221 Switch; 230, 231, 232, 233 Inverting amplifier circuit; 240, 241, 242, 243, 245 OP amplifier; 250, 251, 252, 253, 255 Resistor; 260 Transistor

BEST MODES FOR CARRYING OUT THE INVENTION

Figure 1:
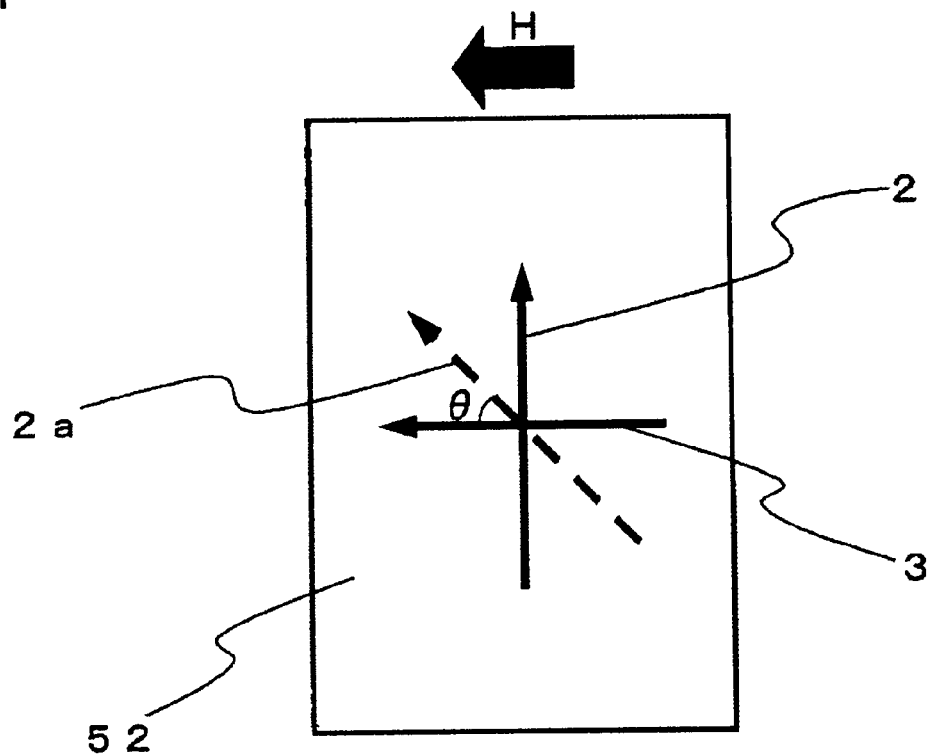
FIG. 1 is a diagram for describing the direction of magnetization of the free layer and the fixed layer of a magnetoresistive element.

With reference to FIG. 1, a specific detect operation of a magnetic field detector using a spin valve-type magnetoresistive element is described first.

FIG. 1 is a schematic diagram showing the direction of magnetization of the free layer and the fixed layer of a magnetoresistive element 52. In FIG. 1, the direction of magnetization 2 of the free layer of the spin valve-type magnetoresistive element forms an angle of 90° with the direction of magnetization 3 of the fixed layer. Upon application of a magnetic field in the direction along direction of magnetization 3 of the fixed layer of the spin valve-type magnetoresistive element, the direction of magnetization of the free layer is changed by an external magnetic field. In the process, in accordance with the angle that the direction of magnetization 2a of the free layer thus changed forms with direction of magnetization 3 of the fixed layer, the resistance value of the magnetoresistive element changes linearly.

Specifically, in the case where direction of magnetization 3 of the fixed layer is 0° and the angle formed by direction of magnetization 2a of the free layer upon application of the external magnetic field H thereto is θ, the change in element resistance is inversely proportional to cos θ. In the case where the free layer is a soft ferromagnetic layer having a uniaxial anisotropy, cos θ=|H$_k$|/H. Specifically, in the case where an external magnetic field larger than |H$_k$| is applied, direction of magnetization 2a of the free layer is fixed in the direction parallel or antiparallel to the direction of magnetization of the fixed layer and the element resistance changes no more. In other words, H$_k$ is the saturation magnetic field of the free layer.

Figure 2:
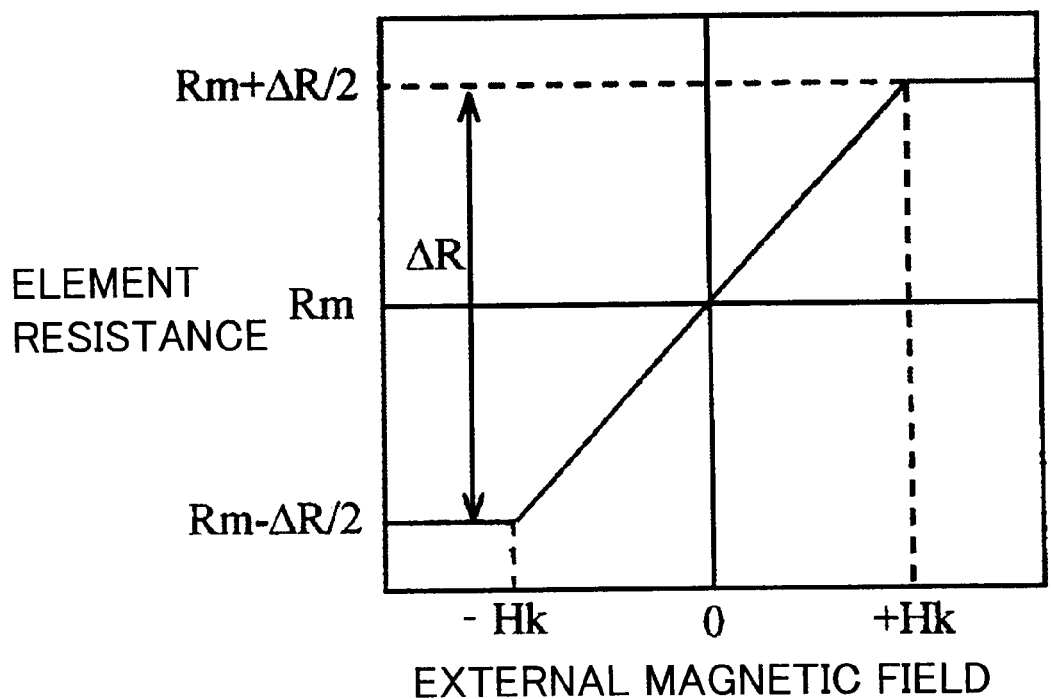
FIG. 2 is a diagram for describing the dependency of the element resistance of the magnetoresistive element on the external magnetic field.

As a result, in the case where direction of magnetization 2 of the free layer forms an angle of 90° with direction of magnetization 3 of the fixed layer as shown in FIG. 2, the element resistance R is given as $$R=R_m+\Delta R/2 \times H/|H_k|(-|H_k|\leq H\leq |H_k|)$$

where R$_m$ is an intermediate value between the maximum resistance value and the minimum resistance value that the element resistance can assume and the element resistance in the nonmagnetic field. Also, ΔR is the magnetoresistance change of the element. This element resistance R is proportional to the external magnetic field, and therefore by acquiring the element resistance, the magnitude of the external magnetic field can be detected. Incidentally, the external magnetic field detected is a direction component of direction of magnetization 3 of the fixed layer. Also, the magnetic field area detectable in the direction of magnetization of the fixed layer, i.e. the operation area is given as −|H$_k$|≦H≦|H$_k$|.

By the element resistance dependent on the external magnetic field described above, the magnetic field can be detected from the current or voltage in the element.

With reference to the drawings, specific examples of embodiments of the present invention are described below.

Embodiment 1

Figure 3:
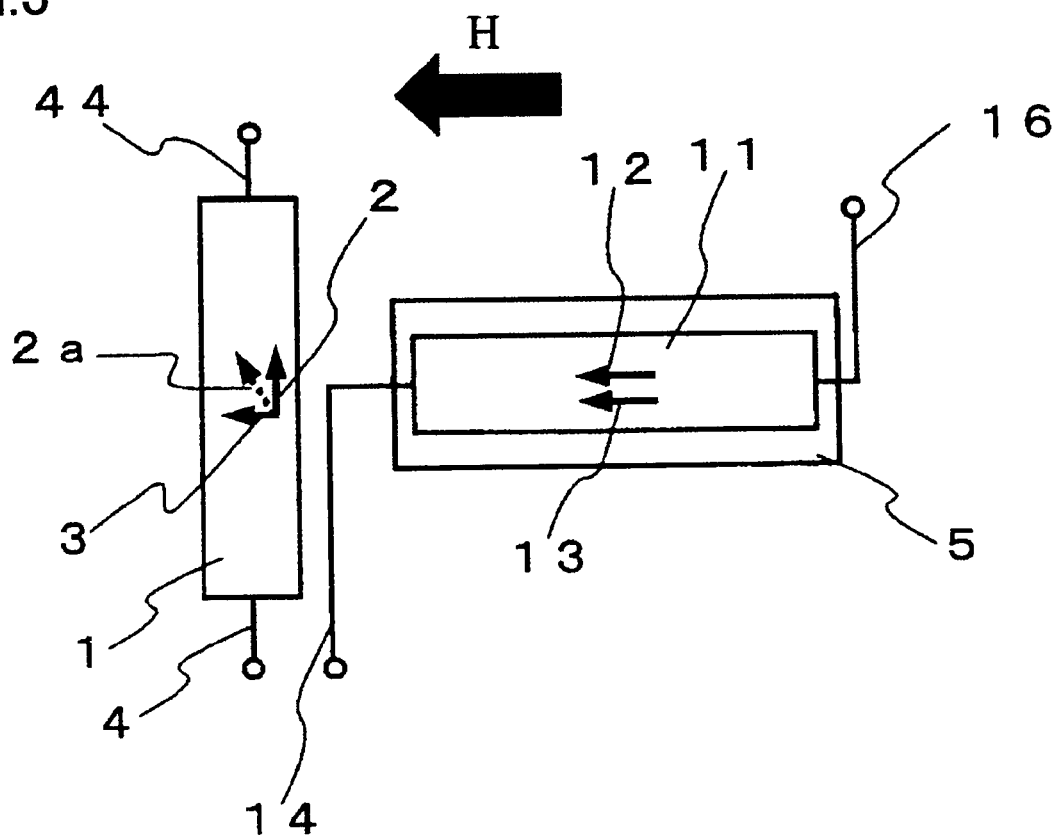
FIG. 3 is a plan view for describing the configuration of a magnetic field detector according to a first embodiment.
Figure 4:
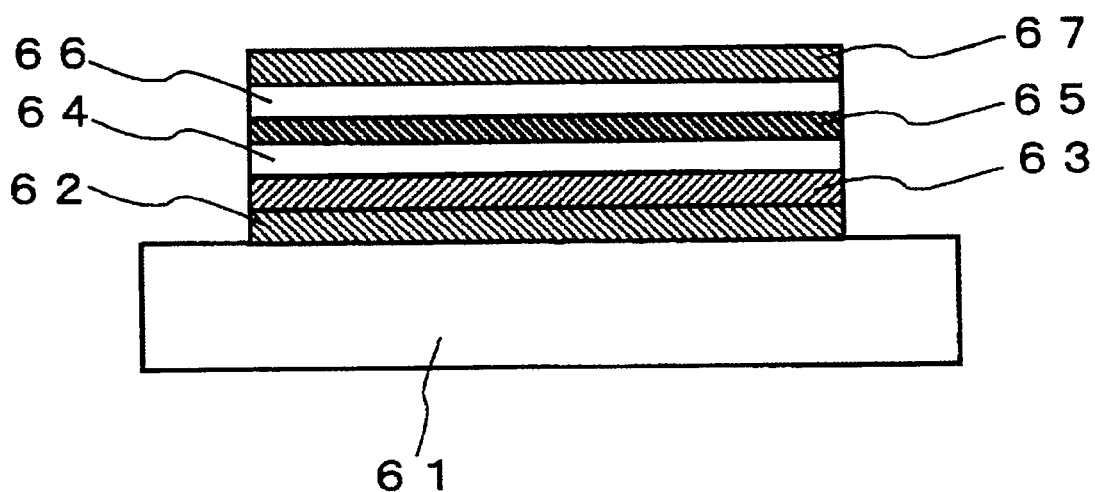
FIG. 4 is a schematic diagram showing a sectional structure of a magnetoresistive element of a magnetic field detector according to the first embodiment.

FIG. 3 is a plan view showing a magnetic field detector according to a first embodiment of the present invention. The shown magnetic field detector has one detecting magnetoresistive element 1 (hereinafter referred to as the detection element) and one reference magnetoresistive element 11 (hereinafter referred to as the reference element). The sectional structures of elements 1, 11 are shown in the schematic diagram of FIG. 4. In FIG. 4, a wiring layer 62 is formed on a substrate 61, and then an antiferromagnetic layer 63 is formed. Next, a first ferromagnetic layer 64 (fixed layer) of a ferromagnetic material with the direction of magnetization thereof fixed by antiferromagnetic layer 63 is formed. Further, a nonmagnetic layer 65 constituting an tunnel insulating layer is formed, above which a second ferromagnetic layer 66 (free layer) of a ferromagnetic material with the direction of magnetization changed by the external magnetic field is formed. Above second ferromagnetic layer 66, a wiring layer 67 is formed. In this case, a configuration is shown in which antiferromagnetic layer 63, first ferromagnetic layer 64, nonmagnetic layer 65 and second ferromagnetic layer 66 are stacked sequentially. Nevertheless, the present invention is not limited to this configuration, but an element can be configured also by stacking second ferromagnetic layer 66, nonmagnetic layer 65, first ferromagnetic layer 64 and antiferromagnetic layer 63 in that order.

In FIG. 3, elements 1, 11 both have a rectangular shape. Elements 1, 11 do not necessarily have the same aspect ratio, but have the same area to secure an equal element resistance.

Due to the rectangular element shape, the directions of magnetization 2, 12 of second ferromagnetic layer 66 of each of elements 1, 11 are along the length of the elements due to the magnetic shape anisotropy. Direction of magnetization 3 of first ferromagnetic layer 64 of detection element 1, on the other hand, is orthogonal, in the element plane, to direction of magnetization 2 of second ferromagnetic layer 66 of detection element 1 in the nonmagnetic field. Further, the direction of magnetization 13 of first ferromagnetic layer 64 of reference element 11 is parallel to direction of magnetization 12 of second ferromagnetic layer 66 of reference element 11 in the nonmagnetic field.

Also, directions of magnetization 3, 13 of first ferromagnetic layers 64 of elements 1, 11 are identical to each other.

Further, first ferromagnetic layers 64 and second ferromagnetic layers 66 of elements 1, 11 are formed and connected with signal detection wires 4, 44, 14, 16 as wiring layers 62, 67, respectively, which are connected to the detection circuit.

First ferromagnetic layers 64 and second ferromagnetic layers 64 of elements 1, 11 are formed of a ferromagnetic material. Materials having ferromagnetism include a metal containing Co, Ni, Fe as a main component such as Co, Fe, Co—Fe alloy, Co—Ni alloy, Co—Fe—Ni alloy, Fe—Ni alloy or an alloy such as Ni—Mn—Sb or Co$_2$—Mn—Ge.

Also, nonmagnetic layer 65 making up a tunnel insulating layer is formed of any insulating material or, for example, a metal oxide such as Ta$_2$O$_5$, SiO$_2$ or MgO or a fluoride.

First ferromagnetic layers 64 of elements 1, 11 are fixed in the direction of magnetization by being stacked with antiferromagnetic layer 63 as described above. Specifically, antiferromagnetic layer 63 fixes the spin direction of first ferromagnetic layers 64, so that the directions of magnetization of first ferromagnetic layers 64 are held in directions 3, 13, respectively. The materials making up the antiferromagnetic layer include Ir—Mn, Ni—Mn, Ni—O, Fe—Mn, Pt—Mn, etc.

Each film described above is formed by, for example, DC magnetron sputtering. Also, it may alternatively be formed by the molecular beam epitaxy (MBE), various sputtering processes, chemical vapor deposition (CVD) process or vapor deposition.

Elements 1, 11 are formed by, for example, photolithography. In this case, films making up second ferromagnetic layer 66, nonmagnetic layer 65 and first ferromagnetic layer 64 are formed, after which the desired pattern is formed by photoresist. After that, the shape of the element can be acquired by ion milling or reactive ion etching. Also, the electron beam or the focused ion beam lithography may be used to form a pattern.

Further, wires 4, 44, 14, 16 are formed of an Al layer, for example.

Detection element 1 and reference element 11 are desirably formed on the same substrate at the same time using the same process. The simultaneous forming of these elements using the film-forming methods and the photolithography described above is accompanied by a very small variation and poses substantially no variation problem in the measurement of the magnetic resistance.

Directions of magnetization 3, 13 of the first ferromagnetic layers of elements 1, 11 are set by the method described below, for example. The magnetic field detector is heated to equal to or higher than the blocking temperature at which the apparent exchange interaction between the antiferromagnetic layer and the first ferromagnetic layer disappears, and the external magnetic field to generate the saturated magnetization of the first ferromagnetic layer is applied in the desired direction. Under this condition, the magnetic field detector is cooled at or below the blocking temperature thereby to acquire the desired direction of magnetization in the first ferromagnetic layer.

According to this embodiment, directions of magnetization 3, 13 of the first ferromagnetic layers of detection element 1 and reference element 11 are parallel to each other, and therefore magnetic field is applied in the same direction at the time of heat treatment. By applying a uniform magnetic field in this way, the magnetic field detector according to this embodiment can be formed.

In this case, the shape of elements 1, 11 is not necessarily a rectangle as long as the directions of magnetization of the second ferromagnetic layers can be defined as desired.

Also, elements 1, 11 are each desirably a TMR element. This makes it possible to produce a large output signal and reduce the element size at the same time.

Figure 5:
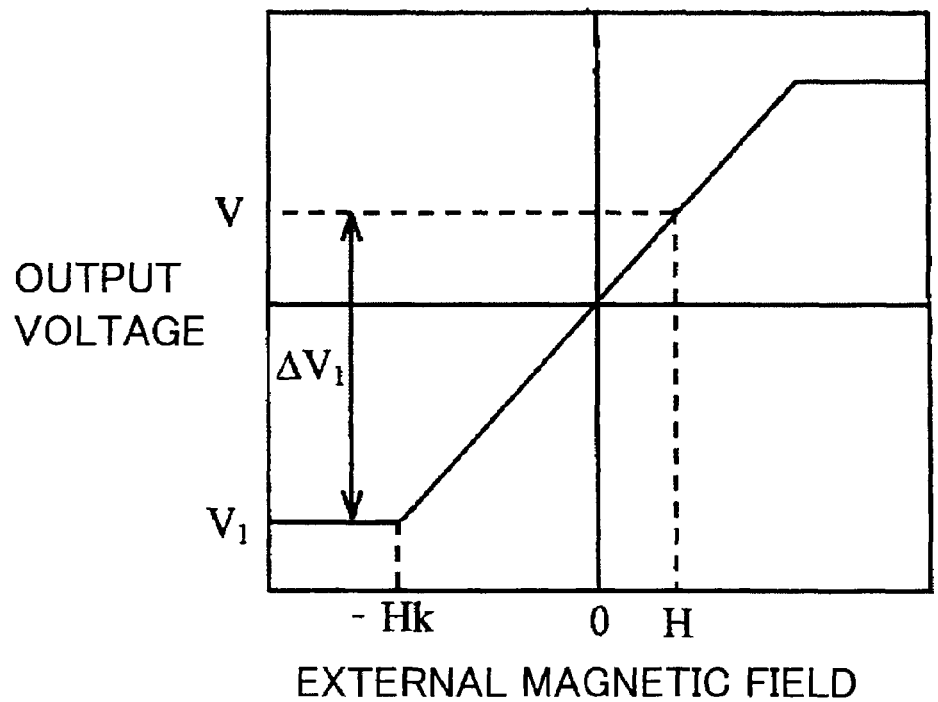
FIG. 5 is a diagram for describing the output signal of the magnetic field detector according to the first embodiment.

With reference to FIGS. 3, 5, the detect operation of the magnetic field detector according to this embodiment is described next.

Elements 1, 11 shown in FIG. 3 are supplied with a predetermined current I through wires 4, 44, 14, 16, respectively, at the time of magnetic field detection. In the case where an external magnetic field H is applied in the same direction as first ferromagnetic layers 3, 13, the element resistance R of detection element 1 in external magnetic field H is given by equation (1) and an output voltage V by equation (2).

$$R = R_m + \Delta R/2 \times H/|H_k| \quad (1)$$

$$V = I \times (R_m + \Delta R/2 \times H/|H_k|) \quad (2)$$

where $R_m$ is the element resistance with the saturation magnetic field applied from an external source, $\Delta R$ the magnetoresistance change of measurement element 1, $H_k$ the strength of the saturation magnetic field, H the strength of the external magnetic field applied, I the strength of the current flowing in measurement element 1, and V the voltage applied to the measurement element.

In reference element 11, on the other hand, directions of magnetization 12, 13 in the nonmagnetic field of the second and first ferromagnetic layers are the same as the direction of magnetization of external magnetic field H, and therefore, even in the case where external magnetic field H is applied, direction of magnetization 12 of the second ferromagnetic layer and direction of magnetization 13 of the first ferromagnetic layer of reference element 11 remain the same, and the element resistance of reference element 11 assumes the same value as the saturation value of the resistance of detection element 1 in the negative magnetic field. From this, an element resistance $R_1$ and an output voltage $V_1$ obtained in reference element 11 are given by equations (3), (4), respectively.

$$R_1 = R_m - \Delta R/2 \quad (3)$$

$$V_1 = I \times (R_m - \Delta R/2) \quad (4)$$

The difference $\Delta V_1$ between the output voltages of detection element 1 and reference element 11 is expressed by equation (5).

$$\Delta V_1 = I \times (1 + H/|H_k|) \times \Delta R/2 \quad (5)$$

This equation is modified as $$H = (2 \times \Delta V_1/I \times \Delta R - 1) \times H_k \quad (6)$$

where the relation between V, $V_1$, $\Delta V_1$, external magnetic field H and saturated magnetic field $H_k$ is shown in FIG. 5. Also, $\Delta R/2$ is the difference of the output signals in the nonmagnetic field between reference element 11 and detection element 1, and by determining the difference of the output signals in the nonmagnetic field, $\Delta R$ can be determined in real time at the time of measurement. Specifically, even in the case where $\Delta R$ changes due to the temperature change, etc. at the time of measurement, the accurate value of $\Delta R$ can be determined easily. Also, V, $V_1$, $H_k$ are known values, and therefore external magnetic field H can be determined using equation (6).

The output signals described above can be obtained also by numerical operation after converting the output signals obtained from detection element 1 and reference element 11 into numerical signals, respectively.

According to this embodiment, a predetermined current is supplied to each of elements 1, 11. Nevertheless, these currents are not necessarily predetermined for each of elements 1, 11. In such a case, as far as the ratio of magnitude between the currents supplied to elements 1, 11 is known, external magnetic field H can be determined using equations (3) to (6).

Also, direction of magnetization 2 of the second ferromagnetic layer and direction of magnetization 3 of the first ferromagnetic layer of detection element 1, though orthogonal to each other in the element plane according to this embodiment, are not necessarily so orthogonal. Unless direction of magnetization 2 of the second ferromagnetic layer and the direction of magnetization 1 of the first ferromagnetic layer are parallel or antiparallel to each other, the element resistance is changed by external magnetic field H and therefore external magnetic field H can be detected.

Also, according to this embodiment, direction of magnetization 13 of the first ferromagnetic layer of reference element 11 and direction of magnetization 12 of the second ferromagnetic layer of reference element 11 are parallel, and may alternatively be antiparallel to each other. In the case where they are antiparallel, the element resistance of reference element 11 assumes the same value as the saturation value of the resistance of detection element 1 in the positive magnetic field.

According to this embodiment, the differential detection of reference element 11 and detection element 1 is used and therefore a large output signal is obtained. Also, the resistance change rate $\Delta R$ is obtained from the difference between the output signals of detection element 1 and reference element 11 in the nonmagnetic field. Even in the case where the element resistance is varied due to the reproducibility at the time of fabrication or the resistance value of the element is changed due to the temperature, therefore, a stable output signal can be obtained.

Also, directions of magnetization 3, 13 of the first ferromagnetic layers of elements 1, 11 are identical to each other, and therefore the magnetic field detector according to this embodiment can be easily fabricated.

Further, reference element 11 can include a magnetic shield 5 for shielding the external magnetic field.

Magnetic shield 5 of reference element 11 is required to be formed of a material high in permeability such as a NiFe layer. Also, other alloys containing Co, Ni or Fe as a main component can be employed.

The provision of magnetic shield 5 protects reference element 11 from the effect of external magnetic field. As a result, as long as direction of magnetization 12 of the second ferromagnetic layer and direction of magnetization 13 of the first ferromagnetic layer of the reference element are parallel or antiparallel to each other, the directions of magnetization can be set arbitrarily.

Embodiment 2

Figure 6:
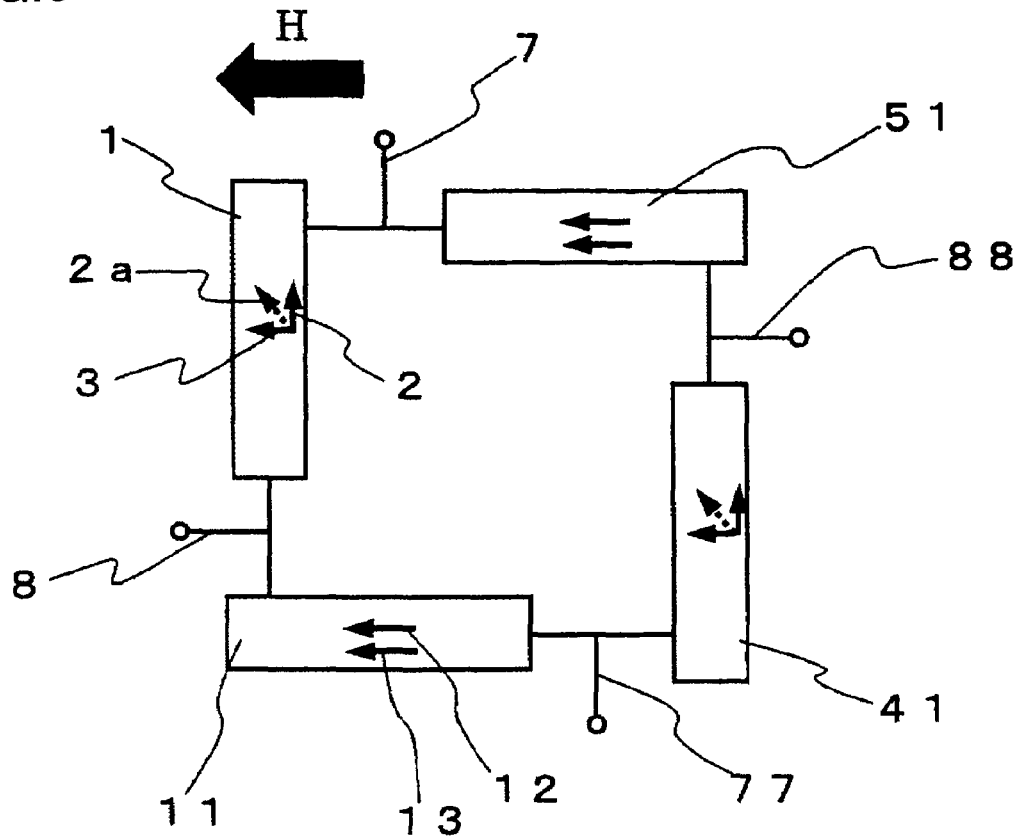
FIG. 6 is a plan view for describing the configuration of a magnetic field detector according to a second embodiment.

According to this embodiment, as shown in FIG. 6, a bridge circuit is formed by adding a set of elements having the same configuration to detection element 1 and reference element 11 of the first embodiment. The detection element 41 and the reference element 51 added have the same configuration as detection element 1 and reference element 11, respectively, and therefore are not described again. Also, the directions of magnetization of the first and second ferromagnetic layers of detection elements 1 and 41 are the same. In this case, $\Delta V_1$ can be obtained by supplying the current from wires 7 to 77 and measuring the potential difference between wires 8 and 88.

According to this embodiment, the elements are formed as a bridge circuit and therefore a larger output can be obtained.

Embodiment 3

Figure 7:
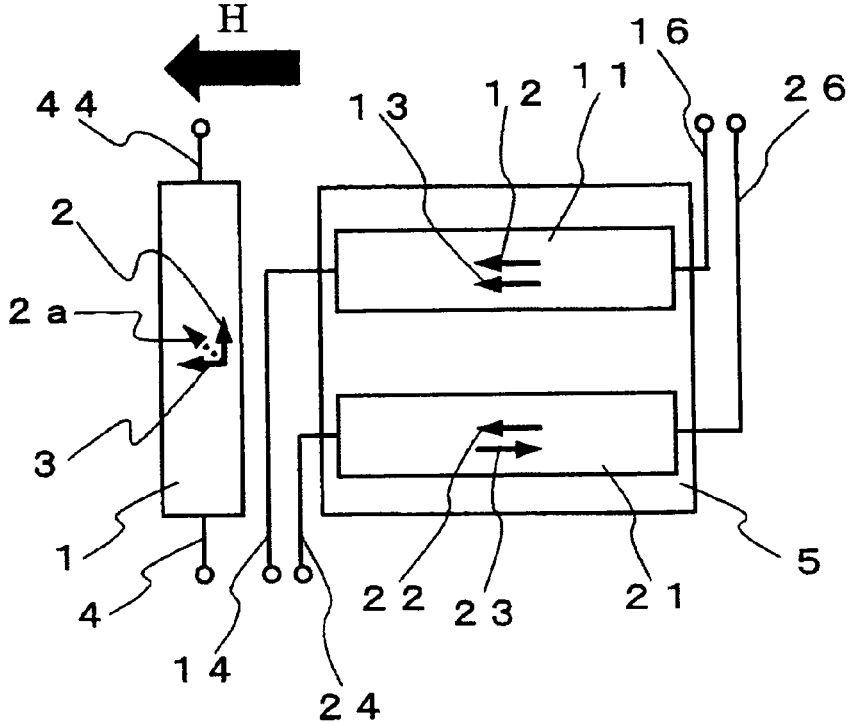
FIG. 7 is a plan view for describing the configuration of a magnetic field detector according to a third embodiment.

FIG. 7 is a plan view showing a magnetic field detector according to a third embodiment of the present invention. The magnetic field detector according to this embodiment further includes a reference element 21 in the magnetic field detector according to the first embodiment. In this embodiment, the same component parts as those in the first embodiment are designated by the same reference numerals, respectively. Elements 1, 11, 21 have a similar stack structure to the first embodiment. In this embodiment, elements 1, 11, 21 are all formed in a rectangle. Elements 1, 11, 21 have not necessarily the same aspect ratio but have the same area to equalize the element resistance.

Of the directions of magnetization 3, 13, 23 of the first ferromagnetic layers of elements 1, 11, 21, direction of magnetization 3 and direction of magnetization 13 are parallel to each other, and direction of magnetization 13 and direction of magnetization 23 are antiparallel to each other. Direction of magnetization 2 of the second ferromagnetic layer of detection element 1 in the nonmagnetic field is orthogonal to direction of magnetization 3 of the first ferromagnetic layer in the element plane. Also, the directions of magnetization 12, 22 of the second ferromagnetic layers of reference elements 11, 21 in the nonmagnetic field are parallel and antiparallel, respectively, to directions of magnetization 13, 23 of the respective first ferromagnetic layers.

The second and first ferromagnetic layers of elements 1, 11, 21 are connected to signal detection wires 4, 44, 14, 16, 24, 26 and further to the detection circuit. One of wires 4, 44 connected to detection element 1 is connected to the second ferromagnetic layer of the element, and the other to the first ferromagnetic layer thereof. Wires 14, 16, 24, 26 of reference elements 11, 21 are also connected to similar positions.

Elements 1, 11, 21 are preferably TMR elements, whereby a large output signal can be output while at the same time reducing the element size.

Directions of magnetization 3, 13, 23 of the first ferromagnetic layers of elements 1, 11, 21 can be determined, like in the first embodiment, by heat treatment, for example. Though not shown, a wire is formed just above or just below the element, and a current is supplied in the desired direction to generate the saturated magnetization of the first ferromagnetic layer are not lower than the blocking temperature at which the magnetic interaction between the antiferromagnetic layer and the first ferromagnetic layer disappears. Under this condition, the temperature is reduced at or below the blocking temperature so that the desired direction of magnetization is obtained in the first ferromagnetic layer. This magnetic field is not limited to the magnetic field generated by supplying the current to a wire, but a magnetic field applied locally.

With regard to directions of magnetization 3, 13, 23 of the first ferromagnetic layer described above, directions of magnetization 3, 13 can be determined by local heat treatment of elements 1, 11 with an external magnetic field applied thereto, for example, after which direction of magnetization 23 can be determined by local heat treatment of element 21 with a magnetic direction applied in reverse direction.

With reference to FIG. 7, the operation of the magnetic field detector according to this embodiment is described next.

Elements 1, 11, 21 shown in FIG. 7 are each supplied with a predetermined current I through wires 4, 14, 24 at the time of detection of a magnetic field. In the process, the element resistance of detection element 1 in the external magnetic field H can be determined from equation (1) and the output voltage from equation (2). In this case, reference element 11 is such that direction of magnetization 12 of the second ferromagnetic layer and direction of magnetization 13 of the first ferromagnetic layer are parallel to each other, while reference element 21 is such that direction of magnetization 22 of the second ferromagnetic layer and direction of magnetization 23 of the first ferromagnetic layer are antiparallel to each other. As a result, reference elements 11, 21 assume the same value as the saturation value of the resistance of detection element 1 in the positive and negative magnetic fields. The output voltages $V_1$, $V_2$ obtained in reference elements 11, 21 are expressed by equations (5), (6), respectively.

$$V_1 = I \times (R_m - \Delta R/2) \tag{7}$$

$$V_2 = I \times (R_m + \Delta R/2) \tag{8}$$

As a result, the difference $\Delta V_1$ between the output voltages obtained in detection element 1 and reference element 11 is given below.

$$\Delta V_1 = I \times (1 + H/|H_k|) \times \Delta R/2 \tag{9}$$

In similar fashion, the difference $\Delta V_2$ between the output voltages obtained in detection element 1 and reference element 21 is given as $$\Delta V_2 = I \times (1 - H/|H_k|) \times \Delta R/2 \tag{10}$$

Further, the difference between $\Delta V_1$ and $\Delta V_2$ is given as $$\Delta V_1 - \Delta V_2 = I \times \Delta R \times H/|H_k|$$

In this equation, $\Delta R$ can be determined each time from the difference of the output signals between the two reference elements 11, 21. This is by reason of the fact that the saturation magnetic field of the elements according to this embodiment is a predetermined known value, and the resistance change rate can be obtained by determining the magnetic resistance in the saturation magnetic field. Even in the case where the resistance change rate changes under the effect of a resistance value change due to the temperature or resistance value variations between the elements, therefore, the resistance change rate can be determined from the outputs of reference elements 11, 21 each time of measurement. Thus, the external magnetic field can be detected accurately using the resistance change rate in the environment of actual operation.

The output signals described above can be obtained also by the numerical operation after the output signals obtained from detection element 1 and reference elements 11, 21 are converted into numerical signals.

According to this embodiment, elements 1, 11, 21 are each supplied with a predetermined current. This current, however, is not necessarily predetermined for each of elements 1, 11, 21. In such a case, as long as the ratio of magnitude between the currents supplied to elements 1, 11, 21 is known, the external magnetic field H can be determined using the equations described above.

According to this embodiment, the differential detection between the two reference elements 11, 21 and detection element 1 is used, and therefore a large output signal can be obtained.

Further, according to this embodiment, the resistance change rate $\Delta R$ is obtained from the output signals of reference elements 11, 21, and therefore a stable output signal can be obtained even in the case where the element resistance is varied due to the reproducibility at the time of element fabrication or the resistance value of the element changes due to the temperature.

Also, since both the maximum and minimum values of the output signal of detection element 1 are obtained, a still higher reliability and accuracy are achieved.

Also, reference elements 11, 21 may include a magnetic shield 5 for shielding the external magnetic field.

Magnetic shield 5 is formed of a material similar to the one employed in the first embodiment.

The provision of magnetic shield 5 protects reference elements 11, 21 from the effects of the external magnetic field. As long as direction of magnetization 12 of the second ferromagnetic layer is parallel to the direction of magnetization 13 of the first ferromagnetic layer of reference element 11 and direction of magnetization 22 of the second ferromagnetic layer is antiparallel to direction of magnetization 23 of the first ferromagnetic layer of reference element 21, therefore, directions of magnetization 12, 13 of the second ferromagnetic layers of reference elements 11, 21 may be set arbitrarily.

Also, $\Delta V_1$, $\Delta V_2$ can be detected by configuring a bridge circuit using detection element 1 and reference elements 11, 21 in a similar manner to the second embodiment.

Embodiment 4

Figure 8:
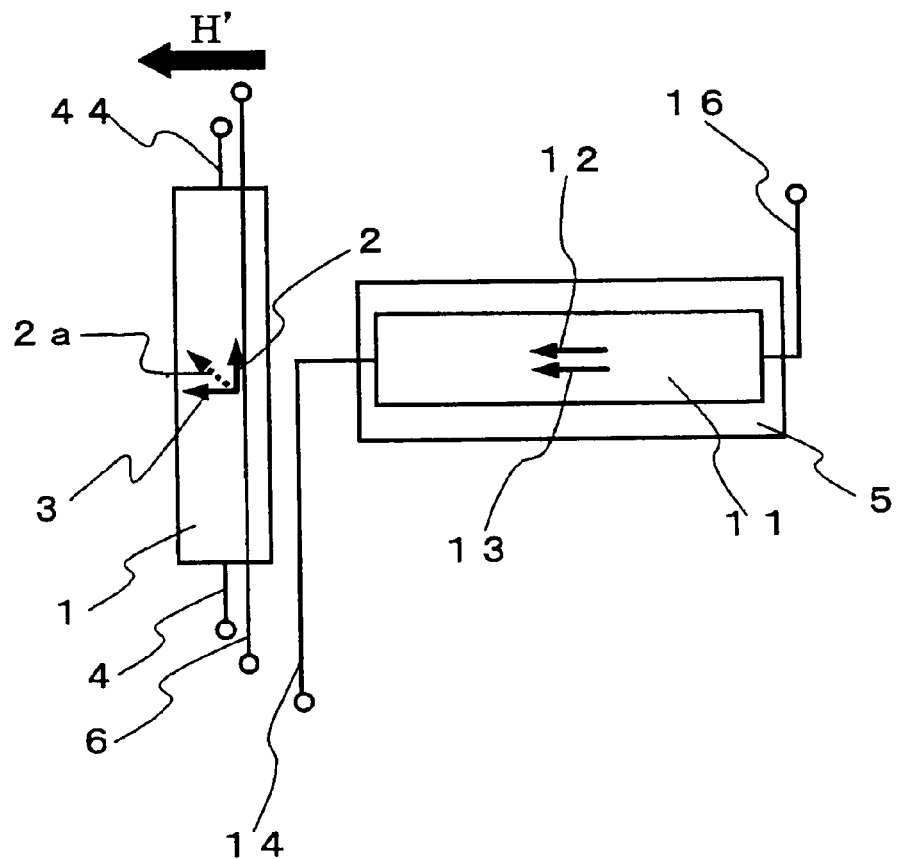
FIG. 8 is a plan view for describing the configuration of a magnetic field detector according to a fourth embodiment.

FIG. 8 is a plan view showing the magnetic field detector according to a fourth embodiment of the present invention. The magnetic field detector shown in this embodiment, in addition to the configuration of FIG. 3 and the first embodiment, includes a wire 6 for applying a magnetic field to detection element 1. This wire 6 is arranged in parallel to direction of magnetization 2 of the second ferromagnetic layer, for example, just above detection element 1. Here, the same component elements as those in FIG. 3 are designated by the same reference numerals, respectively, and not described again.

In this case, a predetermined current is supplied to wire 6 arranged just above detection element 1 in the nonmagnetic field in advance. As a result, a known magnetic field can be applied to detection element 1. In the process, the direction of magnetization of the second ferromagnetic layer of detection element 1 is rotated in accordance with the magnetic field applied in direction of magnetization 2a by the applied magnetic field.

In the case where a magnetic field H' is applied by the current flowing in wire 6 and a predetermined current I is supplied to detection element 1, an output voltage $V_3$ of detection element 1 is given as $$V_3 = I \times (R_m + \Delta R/2 \times H'/|H_k|) \tag{11}$$

In similar fashion, the output voltage with a predetermined current I supplied to reference element 11 can be determined from equation (4), and therefore the difference between the output voltages is given as $$V_3 - V_1 = I \times (1 + H'/|H_k|) \times \Delta R/2 \tag{12}$$

where H' and I are known values, and therefore, as long as $H_k$ is known, $\Delta R$ can be accurately determined using equation (12). Also, in the case where $H_k$ is not known, $H_k$ can be determined from equation (12) using the known values I and H' by determining $\Delta R$ from the difference between the output signals of detection element 1 and reference element 11 in the nonmagnetic field according to the method described in the first embodiment. Under the condition lacking the external magnetic field, the saturation magnetic field can be detected even in the case where there is only one point of wiring current magnetic field H'.

The saturation magnetic field described above is not necessarily detected in the nonmagnetic field, but can be detected by applying the wiring current magnetic fields −H' or +H', for example, at two different points as far as an external magnetic field, if applied, remains unchanged. This detection can be carried out as required, such as before or during the measurement of the external magnetic field when temperature changes.

Using the saturation magnetic field determined by the method described above, the external magnetic field is detected by the same method as in the first embodiment.

In this case, the saturation magnetic field can be detected also by configuring a bridge circuit using detection element 1 and reference element 11 by the same method as in FIG. 6 and the second embodiment.

The output signal described above can be obtained also by numerical operation after converting the output signals obtained from detection element 1 and reference element 11 into numerical signals, respectively.

According to this embodiment, a configuration in which an external magnetic field can be arbitrarily applied to detection element 1 makes it possible to detect the saturation magnetic field without the external magnetic field. As a result, the saturation magnetic field can be detected at any time as required only by the detector. Thus, the resolution of the detector can be calibrated as required without using an external magnetic field generator.

Figure 9:
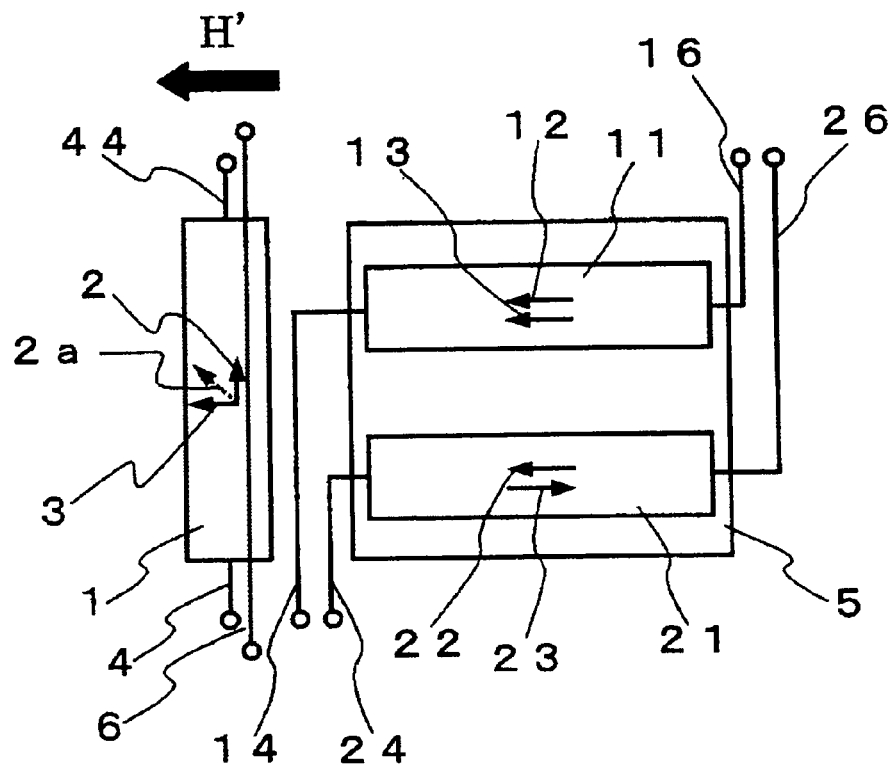
FIG. 9 is a plan view for describing the configuration of another magnetic field detector according to the fourth embodiment.

Further, as shown in FIG. 9, in addition to the configuration of FIG. 7, wire 6 for applying the magnetic field to the detection element 1 can be arranged. In FIG. 9, the same component elements as those in FIG. 7 are designated by the same reference numerals, respectively, and not described again. By doing the above, the saturation magnetic field of the second ferromagnetic layer of detection element 1 can be detected without any external magnetic field also in the configuration of FIG. 7.

Also, in FIGS. 8, 9, reference elements 11, 21 may include a magnetic shield 5 for shielding the external magnetic field.

The provision of magnetic shield 5 can set the second ferromagnetic layer of reference elements 11, 21 in any arbitrary direction of magnetization.

Embodiment 5

Figure 10:
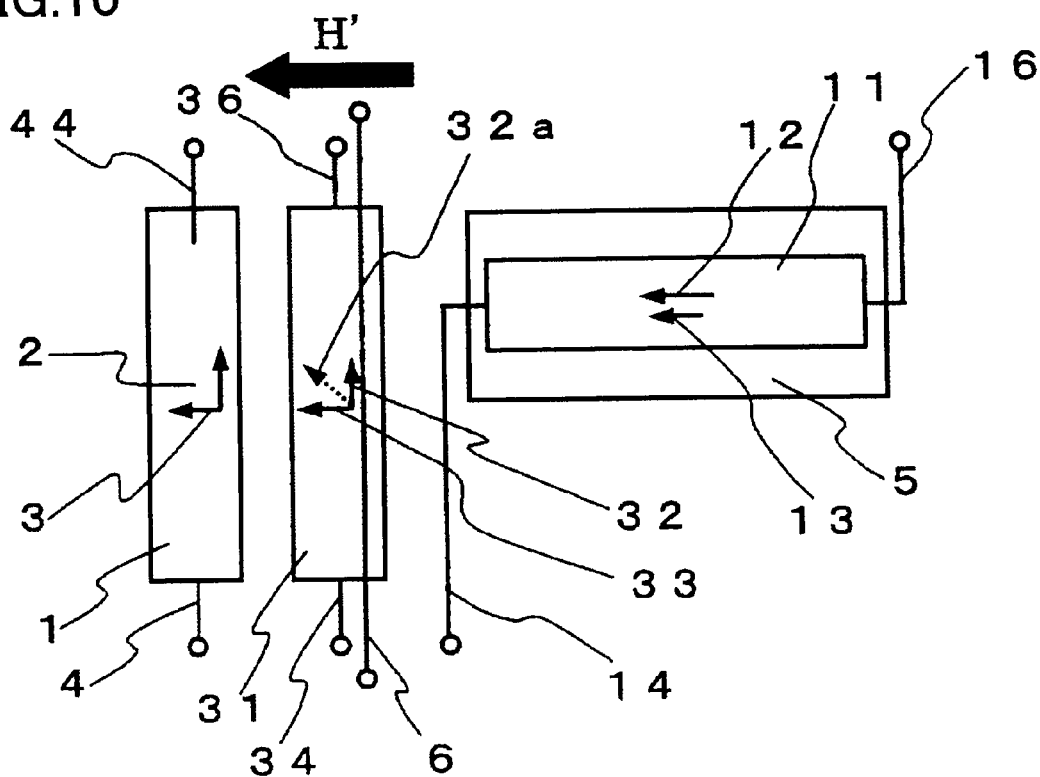
FIG. 10 is a plan view for describing the configuration of a magnetic field detector according to a fifth embodiment.

FIG. 10 is a plan view showing a magnetic field detector according to a fifth embodiment of the present invention. The magnetic field detector shown here includes, in addition to a similar configuration to the detector shown in FIG. 3 and the first embodiment, a magnetoresistive element for detecting the saturation magnetic field (hereinafter referred to as the saturation magnetic field detection element) 31 exhibiting the same magnetoresistance effect characteristic as detection element 1 against the external magnetic field. In this case, detection element 1 and saturation magnetic field detection element 31 are configured to have the same shape.

Incidentally, saturation magnetic field detection element 31 and detection element 1 are not specifically limited in the arrangement thereof as far as they have the same magnetoresistance effect characteristic. The same component elements as those in FIG. 3 are designated by the same reference numerals, respectively, and not described again.

Also, wire 6 for applying a magnetic field is arranged just above saturation magnetic field detection element 31. This wire 6 is arranged, for example, in parallel to direction of magnetization 2 of the second ferromagnetic layer just above detection element 1.

Also, detection element 1, reference element 11 and saturation magnetic field detection element 31 are preferably formed at the same time on the same substrate by the same process. This simultaneous process is accompanied by a very small variation according to the film-forming method and the photolithography described above, and poses substantially no problem of variations in the measurement of magnetic resistance.

Next, the detect operation of the magnetic field detector according to this embodiment is described.

The operation of magnetic field detection is similar to the detect operation in the first embodiment.

Further, the saturation magnetic field of the second ferromagnetic layer of saturation magnetic field detection element 31 can be detected by a method similar to the fourth embodiment. Detection element 1 and saturation magnetic field detection element 31 have the same magnetoresistance effect characteristic, and therefore, the saturation magnetic field of detection element 1 can be obtained by determining the saturation magnetic field of saturation magnetic field detection element 31.

According to this embodiment, detection element 1 and saturation magnetic field detection element 31 for obtaining the saturation magnetic field of the second ferromagnetic layer are independent of each other. Therefore, the saturation magnetic field can be determined at any time during the detection of the external magnetic field. Thus, the calibration of the resolution during the measurement is made possible and the external magnetic field can be measured with a higher accuracy.

Also, the calibration of the resolution of the magnetic field detector can be carried out without interrupting the measurement of the external magnetic field.

Figure 11:
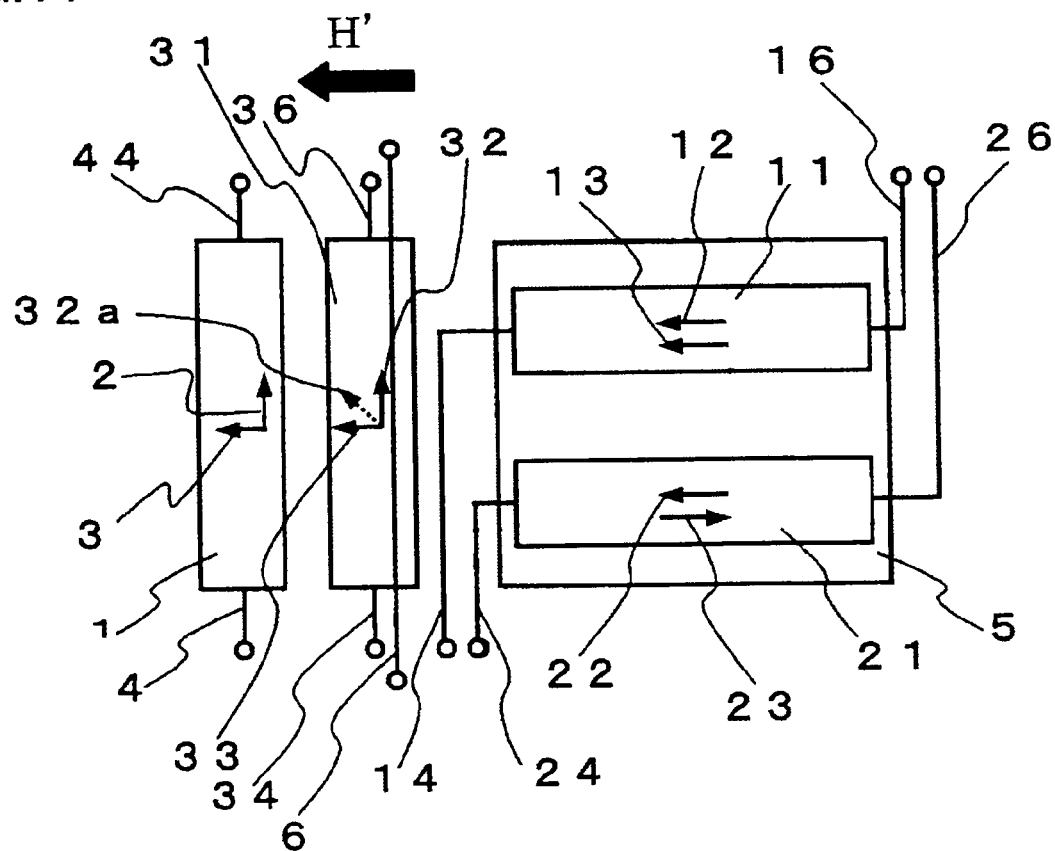
FIG. 11 is a plan view for describing the configuration of another magnetic field detector according to the fifth embodiment.

As shown in FIG. 11, saturation magnetic field detection element 31 can be provided in addition to the configuration of FIG. 7. In FIG. 11, the same component parts as those in FIG. 7 are designated by the same reference numerals, respectively, and not described any further. By doing the above, the saturation magnetic field of the second ferromagnetic layer of detection element 1 can be detected without the external magnetic field during the measurement of the external magnetic field even with the configuration shown in FIG. 7.

Also, in FIGS. 10, 11, reference elements 11, 21 may include magnetic shield 5 for shielding the external magnetic field.

The provision of magnetic shield 5 can set the second ferromagnetic layer of reference elements 11, 21 in an arbitrary direction of magnetization.

Embodiment 6

Figure 12:
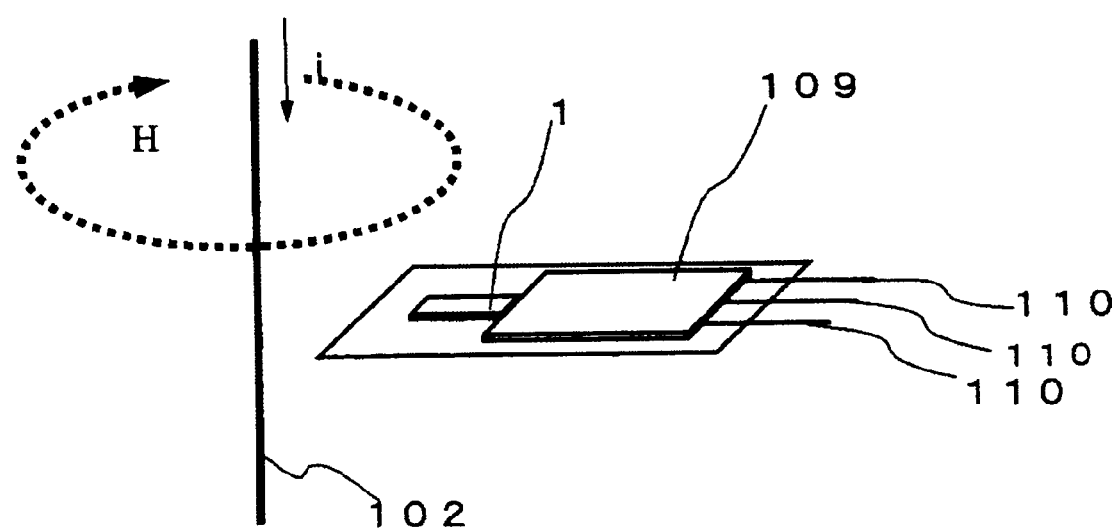
FIG. 12 is a perspective view for describing a current detection device according to a sixth embodiment.

FIG. 12 is a perspective view showing a current detection device according to this embodiment. The current detection device shown in this diagram uses the magnetic field detector shown in FIG. 3 and the first embodiment, for example, and is arranged at a predetermined distance from wire 102 in which the current to be measured flows. Although only detection element 1 is shown in this diagram, the current detection device includes all the components shown in the first embodiment such as a peripheral circuit 109 for output detection and signal processing. Also, it includes wires 110 for supplying power and outputting a signal to the external devices.

Detection element 1 in the current detection device is arranged at such a position that the direction of the external magnetic field generated from wire 102 in which the current to be measured flows coincides with the direction of detection. Specifically, the direction of magnetization of the first ferromagnetic layer of detection element 1 coincides with the direction of the external magnetic field.

Next, the current detect operation of the current detection device according to this embodiment is described.

When the current i to be measured flows in wire 102, the current acts to generate an annular magnetic field in the direction perpendicular to the wire. The magnitude of this magnetic field H is expressed as $H = k \times i/R$, where k is a proportionality constant and R the distance from the wire. In this case, once the distance between the wire and detection element 1 in the current detection device is measured, the proportionality constant k is known. By measuring the magnetic field H by the magnetic field detector shown in the fourth embodiment, therefore, the wire current i can be detected. In the process, the power for actuating the current detection device is supplied through wires 110, and the detection signal is output to the external devices such as a display unit through peripheral circuit 109 and wires 110.

Also, the magnetic field detector according to other embodiments can of course be used as a current detector.

According to this embodiment, the use of the magnetic field detector shown in the present invention makes it possible to produce a stable output signal and calibrate the resolution of the detector even in the case where the temperature changes or the characteristics are varied from one detector to another during current detection, and therefore the current can be detected with high accuracy.

Embodiment 7

Figure 13:
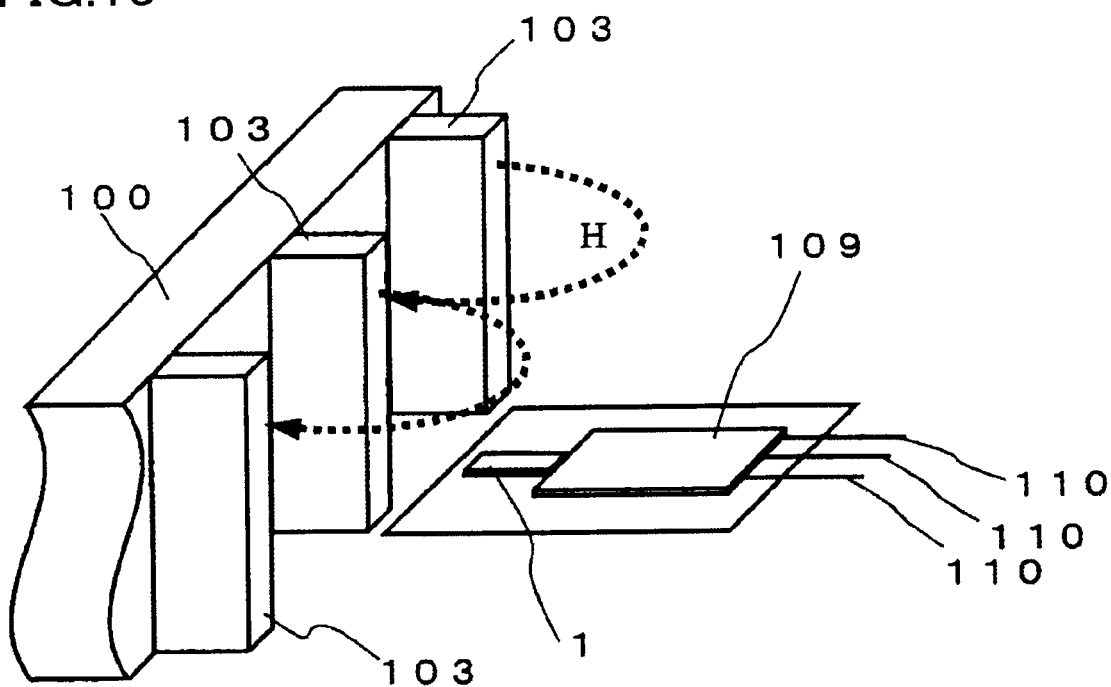
FIG. 13 is a perspective view for describing a position detection device according to a seventh embodiment.

FIG. 13 is a perspective view showing a position detector according to this embodiment. The position detection device shown in this diagram uses, for example, the magnetic field detector shown in FIG. 3 and the first embodiment, and an object to be measured 100 periodically includes magnets 103. Incidentally, the part where object to be measured 100 includes magnets 103 is partially shown in this diagram. Adjacent ones of the magnets, for example, have opposite polarities. Although only detection element 1 is shown in this case, the position detector includes all the components shown in FIG. 3 and the first embodiment, and like the sixth embodiment, includes a peripheral circuit 109 for output detection and signal processing. Also, it includes wires 110 for supplying power and outputting a signal to external devices.

Next, the position detect operation of the position detection device according to this embodiment is described.

With the movement of the object to be measured, the magnetic fluxes from magnets 103 included therein change the magnetic field of the position detector. Due to the periodical arrangement of magnets 103 in the object to be measured, the magnets that have passed through the position detector can be counted by detecting the change in magnetic field of the detector with the movement. Like in the sixth embodiment, the power for the operation of the current detection device is supplied through wires 110, and the detection signal is output to the external devices through peripheral circuit 109 and wires 110. As a result, the distance covered by the object to be measured can be measured. The movement is not necessarily linear, and the amount of rotation of a rotary member can also be detected, for example.

Also, the magnetic field detector according to other embodiments can of course be used as a position detector.

The position detector according to the present invention is not limited to the configuration described above, but can have any configuration that can detect the change in magnetic fluxes from the object to be measured.

In this embodiment, the use of the magnetic field detector according to the present invention makes it possible to produce a stable output signal and calibrate the resolution of the detector even in the case where the temperature changes or the characteristics are varied from one detector to another during the position detection, thereby permitting the position detection with high accuracy.

Embodiment 8

Figure 14:
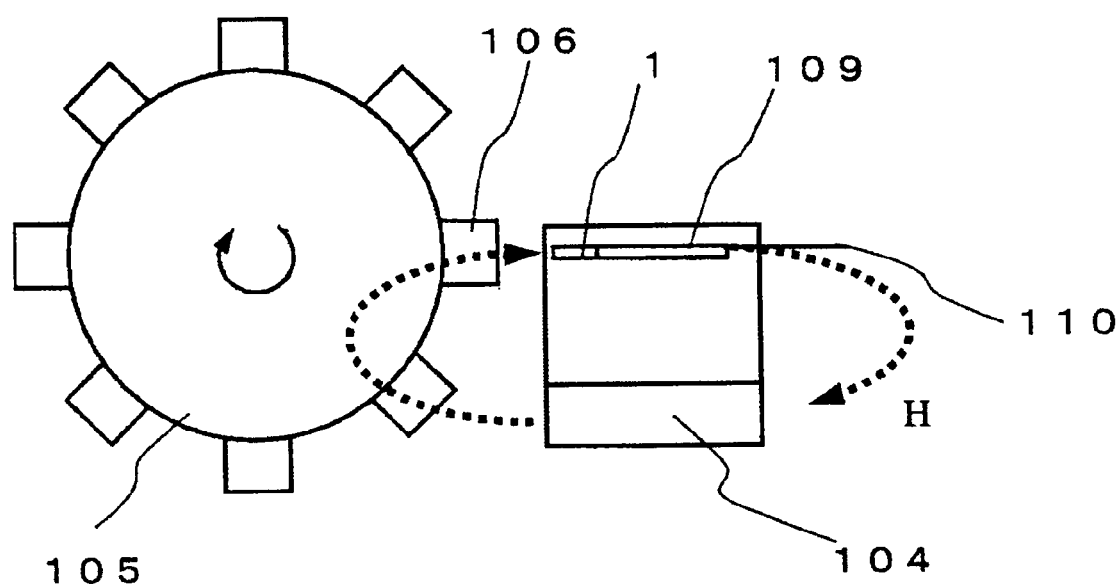
FIG. 14 is a side view for describing a rotation detection device according to an eighth embodiment.

FIG. 14 is a side view showing a rotation detector according to this embodiment. The rotation detector shown in this diagram includes the magnetic detector shown in FIG. 3 and the first embodiment and a permanent magnet 104 magnetized the direction toward the object to be measured. The object to be measured is a gear 105 of a soft ferromagnetic material having a large permeability. Although only detection element 1 is shown, the rotation detector includes all the components shown in FIG. 3 and the first embodiment, and like the sixth embodiment, includes a peripheral circuit 109 for output detection and signal processing. Also, it includes a wire 110 for supplying power and outputting a signal to external devices.

Detection element 1 is arranged in such a direction as to be capable of detecting the external magnetic field generated by permanent magnet 104 and gear 105. The direction of magnetization of the first ferromagnetic layer of detection element 1, for example, is toward the center of gear 105.

Next, the rotation detect operation of the rotation detector according to this embodiment is described.

This rotation detector includes permanent magnet 104 magnetized in the direction toward the object to be measured, and therefore the teeth 106 of gear 105 constituting the object to be measured are magnetized by the magnetic fluxes from magnet 104. In the case where gear 105 is rotated by teeth 106 thus magnetized, the magnetic field in magnetic field detector 101 changes. By detecting the change in magnetic field due to the rotation of teeth 106, the number of the teeth passed through magnetic field detector 101 can be counted. As a result, the rotation amount of the object to be measured can be measured. As in the sixth embodiment, the power for operating the current detection device is supplied through wire 110, and the detection signal is output to external devices through peripheral circuit 109 and wire 110. Not only the rotary motion but also the distance covered by an object adapted to linearly move can be detected.

The rotation detector according to the present invention is not limited to this configuration, but may have any configuration in which the change in magnetic fluxes from the object to be measured can be detected.

According to this embodiment, a highly accurate position detection is possible without arranging any magnet for detecting the magnetic field in the object to be measured. Also, the existing rotary member can be utilized as far as it is in the shape of a gear of a soft ferromagnetic material having a large permeability.

Embodiment 9

Figure 15:
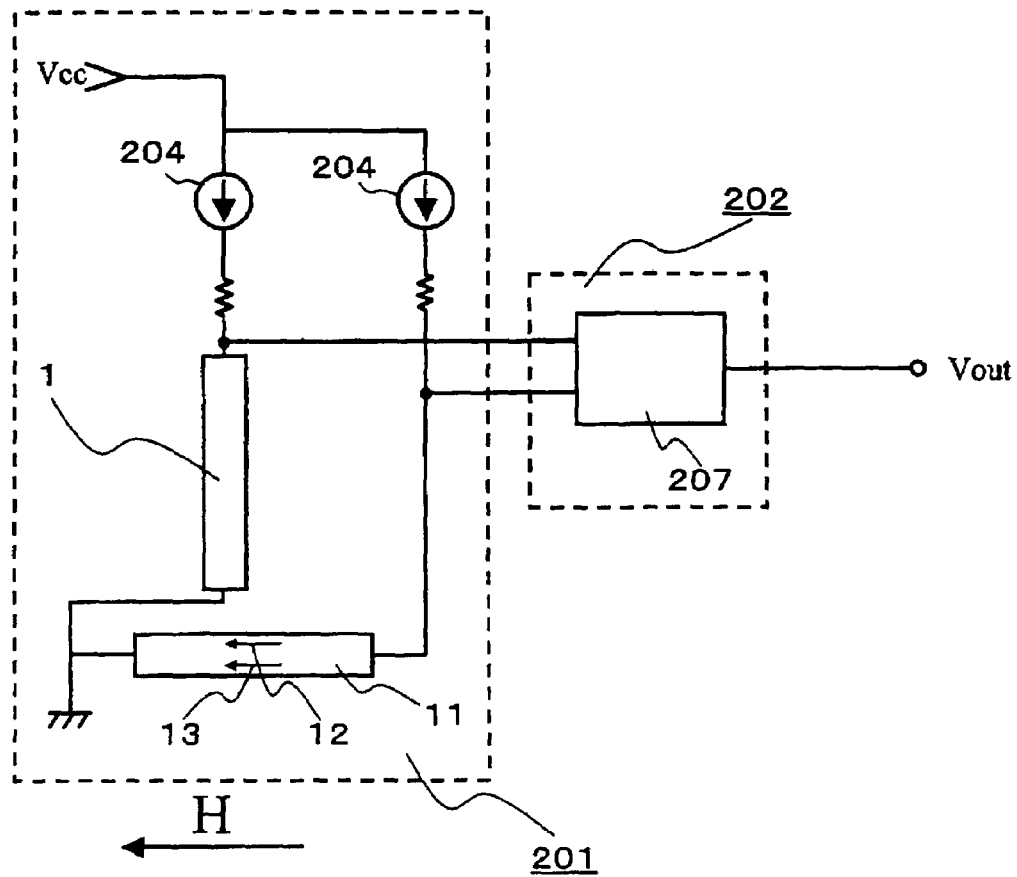
FIG. 15 is a diagram for describing the configuration of a magnetic field detector according to a ninth embodiment.

FIG. 15 illustrates a specific example of a circuit configuration of the magnetic field detector shown in FIG. 3 of the first embodiment, and a circuit block diagram showing a magnetic field detector according to a ninth embodiment of the present invention. With reference to FIG. 15, the configuration of this embodiment is described. The magnetic field detector shown in this diagram is an example of a circuit configuration including the magnetic field detector according to the first embodiment, and has one detection element 1 and one reference element 11. The structure and the fabrication method of elements 1, 11 included in the circuit are similar to those of the first embodiment.

The magnetic field detector according to this embodiment is configured of a resistance-voltage conversion circuit 201 and an add-subtract amplifier circuit 202.

Figure 16:
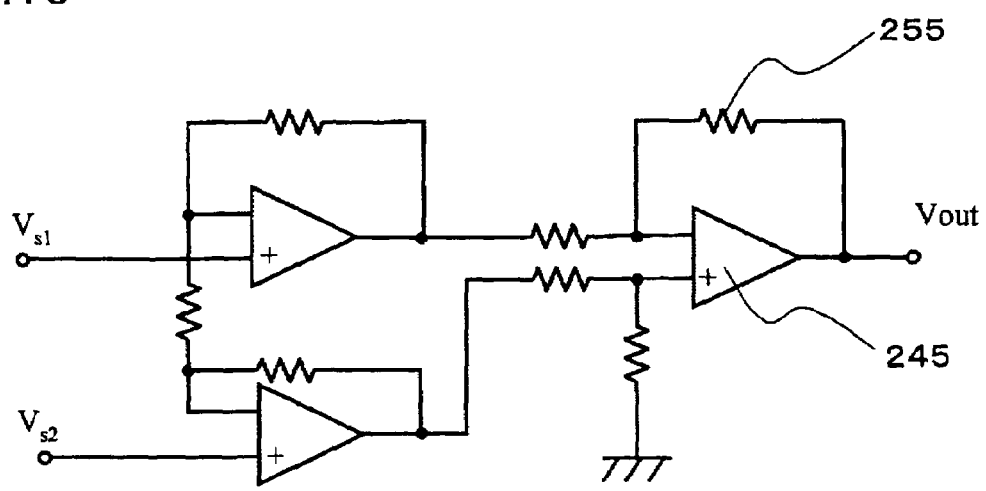
FIG. 16 is a circuit diagram for describing an example of a differential amplifier circuit according to a ninth embodiment.

Resistance-voltage conversion circuit 201 has constant current circuits 204 connected to elements 1, 11, respectively. Also, add-subtract amplifier circuit 202 includes a differential amplifier circuit 207 for differentially amplifying the output voltages produced from detection element 1 and reference element 11, and outputs a voltage based on the difference between the output voltages produced from detection element 1 and reference element 11. Differential amplifier circuit 207 is configured, for example, as a circuit including OP amplifiers 245 and resistors 245 as shown in FIG. 16. In this case, the same reference numerals in the diagram designate similar OP amplifiers and resistors.

With reference to FIG. 15, the detect operation of the magnetic field detection circuit according to this embodiment is described next.

In resistance-voltage conversion circuit 201, constant current circuit 204 is connected to each of elements 1, 11, in which a predetermined current I flows at the time of detection of a magnetic field. An output voltage from detection element 1 in an external magnetic field H is given by equation (2). In reference element 11, direction of magnetization 12 of the second ferromagnetic layer is parallel to direction of magnetization 13 of the first ferromagnetic layer, and the resistance value thereof is equal to the saturation value in the negative magnetic field of the resistance of the detection element. The output voltages V, $V_1$ produced by detection element 1 and reference element 11 are expressed by equations (2), (4), respectively.

$$V = I \times (R_m + \Delta R/2 \times H/|H_k|) \quad (2)$$

$$V_1 = I \times (R_m - \Delta R/2) \quad (4)$$

Add-subtract amplifier circuit 202 differentially amplifies the output voltages produced from detection element 1 and reference element 11. Assuming that the amplification factor of add-subtract amplifier circuit 202 is α, the output voltage $V_{out}$ is given as follows from equation (5) and the amplification factor α.

$$V_{out} = \alpha \times I \times (1 + H/|H_k|) \times \Delta R/2 \quad (13)$$

where α, I and $|H_k|$ are set values and known, and ΔR can be obtained from the difference between the output signals of detection element 1 and reference element 11 in the nonmagnetic field. Therefore, correspondence can be obtained between output voltage $V_{out}$ and H. For example, $V_{out}$ for the external magnetic field of 0 assumes the following value.

$$V_{out} = \alpha \times I \times \Delta R/2 \quad (14)$$

where assuming that α is set as 2/(I×ΔR) so that the output voltage $V_{out}$ is 1 V, the relation holds that $V_{out}$ (1+H/|H_k|). Therefore, a circuit can be configured in which $V_{out}$=0 V for H=−|H_k| and $V_{out}$=2 V for H=|H_k|.

This embodiment includes the resistance-voltage conversion circuit for converting the resistance of the reference magnetoresistive element and the resistance of the magnetic field detecting magnetoresistive element into voltages, and the add-subtract amplifier circuit for amplifying the difference between the voltages converted from the resistance of the reference magnetoresistive element and the resistance of the magnetic field detecting magnetoresistive element.

As a result, the differential detection is possible using the outputs of reference element 11 and detection element 1, and therefore a large output signal can be obtained. Also, the resistance change rate ΔR is obtained from the difference between the output signals of detection element 1 and reference element 11 in the nonmagnetic field. Even in the case where the element resistance is varied due to the reproducibility at the time of fabrication or the resistance value of the elements changes due to temperature, therefore, a stable output signal can be obtained.

Also, by appropriately setting the amplification factor α, the desired output voltage can be obtained.

Further, as described in the first embodiment, reference element 11 can include a magnetic shield 5 for shielding the external magnetic field.

Magnetic shield 5 of reference element 11 is required to be composed of any material high in permeability such as a NiFe layer. Also, other alloys containing Co, Ni, Fe as a main component can be employed.

The provision of magnetic shield 5 keeps reference element 11 out of the effect of the external magnetic field. Therefore, direction of magnetization 12 of the second ferromagnetic layer and direction of magnetization 13 of the first ferromagnetic layer of the reference element can be set arbitrarily as far as they are parallel or antiparallel to each other.

Further, the provision of a resistance-voltage conversion circuit and an add-subtract amplifier circuit can configure a magnetic field detector operated with a very simple circuit configuration.

Also, a configuration in which the resistance-voltage conversion circuit, the add-subtract amplifier circuit and the multiply-divide circuit are formed of a magnetoresistive element, a bipolar transistor and a resistor arranged on the same substrate makes it possible to suppress the effect of external noises and the temperature change of the transistor and the resistor included in the add-subtract amplifier circuit. The resistor is preferably configured using a material such as a metal oxide film small in resistivity change with temperature.

Embodiment 10

Figure 17:
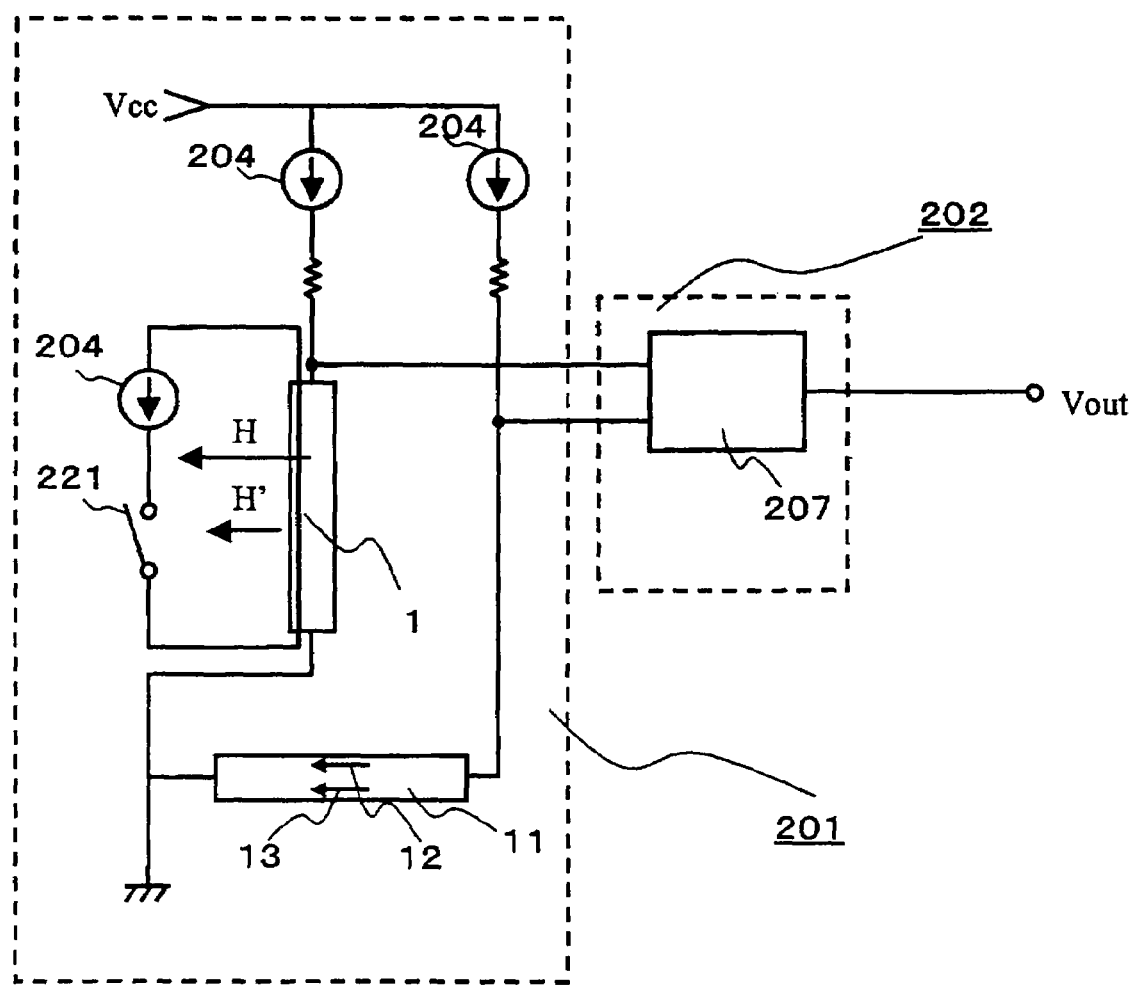
FIG. 17 is a diagram for describing the configuration of a magnetic field detector according to a tenth embodiment.

FIG. 17 is a circuit block diagram showing a magnetic field detection circuit according to a tenth embodiment of the present invention. The magnetic field detection circuit shown in this diagram is equivalent to the magnetic field detection circuit according to the ninth embodiment including a wire 6 for applying a magnetic field to detection element 1 and a circuit for applying a magnetic field. Except for wire 6 for applying a magnetic field to detection element 1 and the circuit for applying a magnetic field, this embodiment is similar to the ninth embodiment and therefore not described.

In the magnetic field detection circuit shown in FIG. 17, wire 6 for applying a current magnetic field to detection element 1 includes a constant current source 220 and a switch 221. Switch 221 is a semiconductor switch, for example, adapted to be switched in synchronism with the input signal from outside the magnetic field detection circuit.

Next, the detect operation of the magnetic field detection circuit according to this embodiment is described. First, in the case where an external magnetic field H is applied with switch 221 off, assuming that the amplification factor of add-subtract circuit 207 is α, the output voltage $V_{out}$ is described by equation (15) with reference to equation (9).

$$V_{out}(H) = \alpha \times I \times (1 + H/|H_k|) \times \Delta R/2 \quad (15)$$

Next, when switch 221 turns on, a current magnetic field H is generated by the current flowing in constant current circuit 220, and therefore the output voltage $V_{out}$ is described as $$V_{out}(H+H') = \alpha \times I \times (1 + (H+H')/|H_k|) \times \Delta R/2 \quad (16)$$

$$V_{out}(H+H') - V_{out}(H) = \Delta \times \Delta R/2 \times H'/|H_k| \quad (17)$$

where α, I and H' are known and therefore the difference between the output signals is a function of $H_k$ and ΔR.

Figure 18:
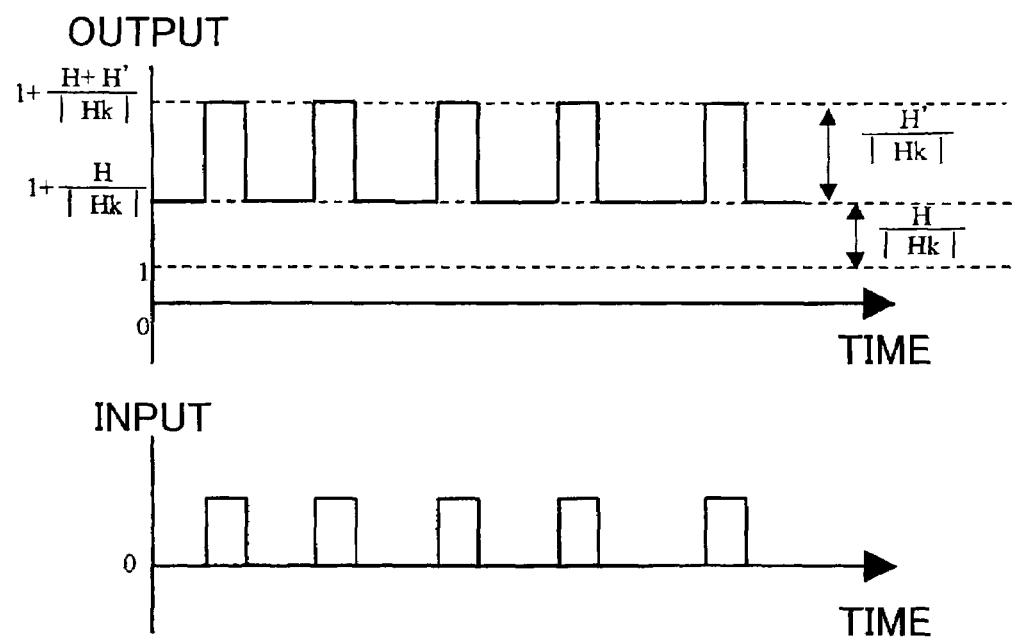
FIG. 18 is a diagram showing the output waveform according to a tenth embodiment.

In the case where $H_k$ is known, for example, ΔR can be determined from the difference in output signal. Also, by determining ΔR from the value associated with the zero external magnetic field, $H_k$ can be determined. Also, in the case where α=2/(I×ΔR), equations $$V_{out}(H) = 1 + H/|H_k| \quad (18)$$

$$V_{out}(H+H') = 1 + (H+H')/|H_k| \quad (19)$$

can be obtained. An example of the output waveform is shown in FIG. 18. In this manner, H'/|H_k| and |H_k| can be determined from the difference in $V_{out}$ output.

According to this embodiment, a configuration in which an external magnetic field can be arbitrarily applied to the detection element makes it possible to detect the saturation magnetic field without any external magnetic field. As a result, the saturation magnetic field can be detected at any time only by the detector as required. As a result, the resolution of the detector can be calibrated without using an external magnetic field generator and whenever required.

Also, according to this embodiment, the use of the differential detection between reference element 11 and detection element 1 can produce a large output signal. Also, since the resistance change ΔR is obtained from the difference in output signal between detection element 1 and reference element 11 in the nonmagnetic field, a stable output signal can be obtained even in the case where the element resistance is varied due to the reproducibility at the time of fabrication or the resistance value of the element is changed due to temperature.

Also, the first ferromagnetic layers of elements 1, 11 have same directions of magnetization 3, 13, and therefore the magnetic field detector according to this embodiment can be easily fabricated.

Further, reference element 11 can include a magnetic shield 5 for shielding the external magnetic field.

Magnetic shield 5 of reference element 11 is required to be formed of a material of high permeability such as a NiFe layer. Also, other alloys containing Co, Ni, Fe as a main component can be employed.

The provision of magnetic shield 5 keeps reference element 11 out of the effect from the external magnetic field. Direction of magnetization 12 of the second ferromagnetic layer of the reference element and direction of magnetization 13 of the first ferromagnetic layer can be determined arbitrarily as far as they are parallel or antiparallel to each other.

Further, the provision of the resistance-voltage conversion circuit and the add-subtract amplifier circuit can make up a magnetic field detector operated with a very simple configuration.

Also, the resistance-voltage conversion circuit, the add-subtract amplifier circuit and the multiply-divide circuit are configured using a magnetoresistive element, a bipolar transistor and a resistor arranged on the same substrate, so that the effect of noises from external sources and the temperature change of the transistor and the resistor included in the add-subtract amplifier circuit can be suppressed. The resistance is desirably provided by a resistor of a material such as a metal oxide film small in resistivity change with temperature.

Embodiment 11

Figure 19:
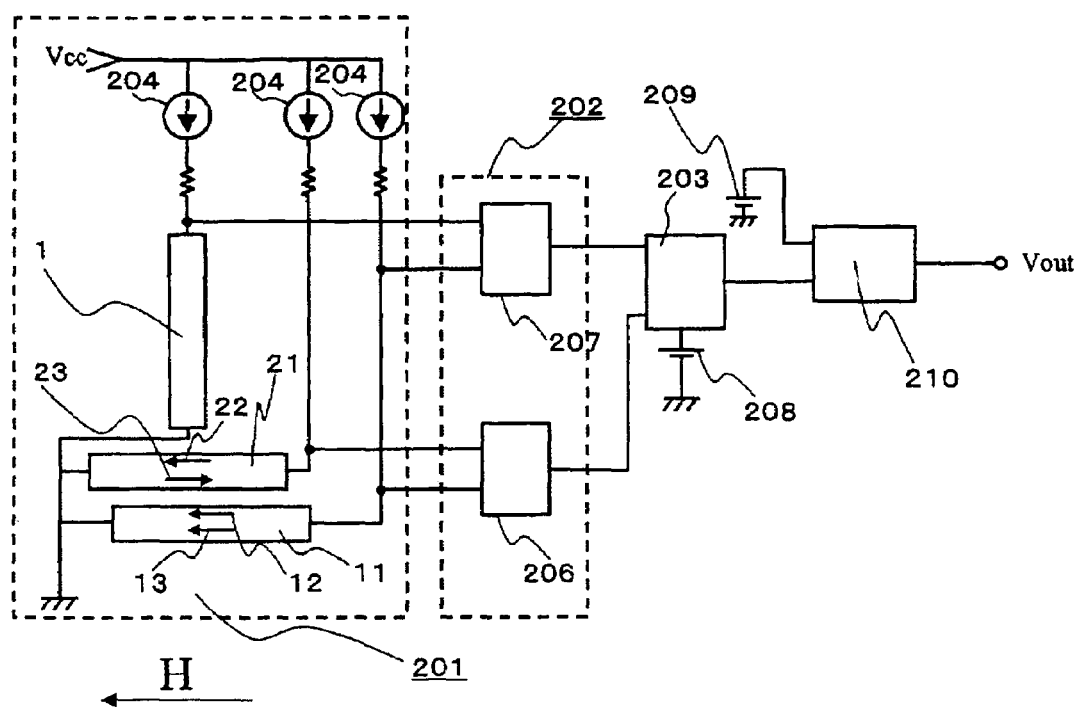
FIG. 19 is a diagram for describing the configuration of a magnetic field detector according to an eleventh embodiment.

FIG. 19 is a circuit block diagram showing a magnetic field detection circuit according to an eleventh embodiment of the present invention. The magnetic field detection circuit shown here is an example of the circuit configuration including a magnetic field detector according to the third embodiment and includes detection element 1 and reference elements 11, 21. The structure and the fabrication method of elements 1, 11, 21 included in the circuit are similar to those of the third embodiment.

The magnetic field detection circuit according to this embodiment is configured of a resistance-voltage conversion circuit 201, an add-subtract amplifier circuit 202 and a multiply-divide circuit 203.

Resistance-voltage conversion circuit 201, like in the ninth embodiment, is configured by connecting a constant current circuit 204 to each of elements 1, 11, 21.

Add-subtract amplifier circuit 202 is a circuit for differentially amplifying the output voltages obtained from detection element 1 and reference elements 11, 12. According to this embodiment, add-subtract amplifier circuit 202 includes a subtract circuit 206 connected to reference elements 11, 21 to output the output voltage difference V to multiply-divide circuit 203 and a differential amplifier circuit 207 connected to detection element 1 and reference element 11 to output the difference $\Delta V_1$ between the output voltages $V_1$ and V to multiply-divide circuit 203. Subtract circuit 206 and differential amplifier circuit 207 are each configured of OP amplifiers and resistors, for example, as shown in FIG. 16.

Figure 20:
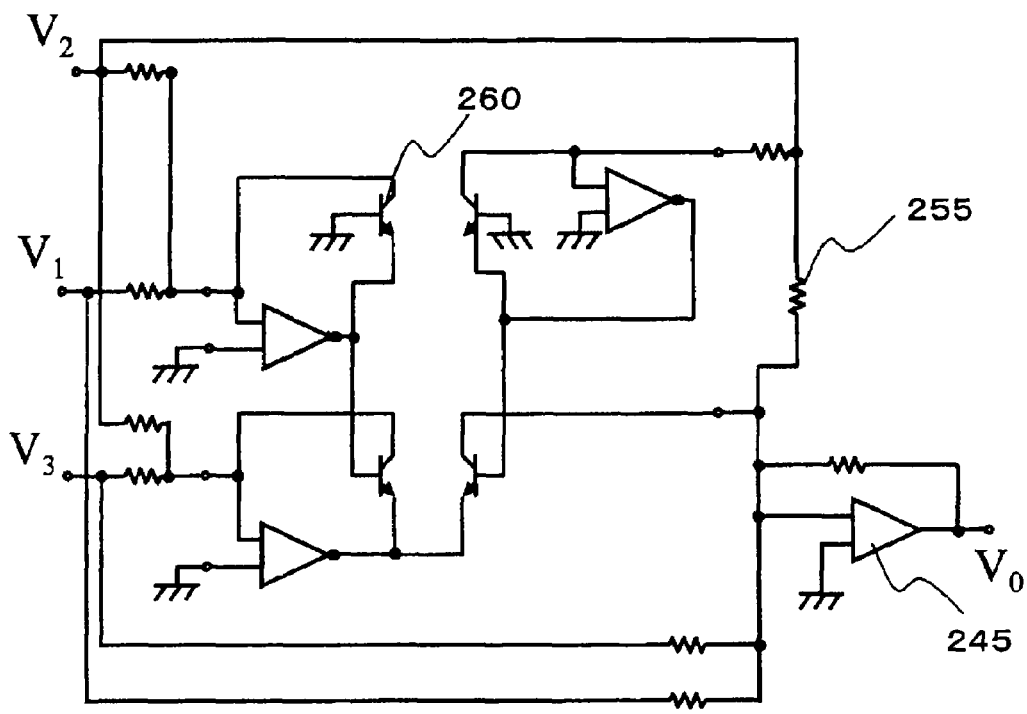
FIG. 20 is a circuit diagram for describing an example of a multiply-divide circuit.

Multiply-divide circuit 203 is a circuit for dividing the inputs, in which $\Delta V_1 \times V_a / V_-$ is output for three inputs, i.e. $\Delta V_1$, $V_-$ and the conversion voltage $V_a$ from a voltage source 208. An example of an internal equivalent circuit is shown in FIG. 20. This equivalent circuit is configured of a circuit including an OP amplifier 245, resistors 245 and transistors 260. In the drawing, the same reference numerals designate similar OP amplifiers, resistors and transistors, respectively.

With reference to FIG. 19, the detect operation of a magnetic field detection circuit according to this embodiment is described next. A constant current I flows in elements 1, 11, 21 of resistance-voltage conversion circuit 201. The output voltage of detection element 1 in the external magnetic field H is given by equation (2). In reference element 11, direction of magnetization 12 of the second ferromagnetic layer and direction of magnetization 13 of the first ferromagnetic layer are parallel to each other, while direction of magnetization 22 of the second ferromagnetic layer and direction of magnetization 23 of the first ferromagnetic layer in reference element 21 are antiparallel to each other. As a result, the output voltages of reference elements 11, 21 are given by equations (7), (8) like the saturation value in the positive and negative magnetic fields of the resistance of detection element 1. In detection element 1 and reference elements 11, 21, output voltages V, $V_1$, $V_2$ expressed by equations (2), (7), (8) are output to add-subtract amplifier circuit 202.

$$V = I \times (R_m + \Delta R/2 \times H/|H_k|) \tag{2}$$

$$V_1 = I \times (R_m - \Delta R/2) \tag{7}$$

$$V_2 = I \times (R_m + \Delta R/2) \tag{8}$$

In add-subtract amplifier circuit 202, the output voltages obtained in detection element 1 and reference elements 11, 21 are differentially amplified. According to this embodiment, the difference V between the output voltages of reference elements 11, 21 and the amplification value of $\Delta V_1$ are output. In the process, by setting the amplification factor of subtract circuit 206 to α and the amplification factor of differential amplifier circuit 207 to α, the output from differential amplifier circuit 207 is given by equation (9) below.

$$\alpha \times \Delta V_1 = \alpha \times I \times \Delta R \times (1 + H/|H_k|)/2 \tag{20}$$

In similar fashion, the output from subtract circuit 206 is given as $$V_- = \alpha(V_2 - V_1) = \alpha \times I \times \Delta R \tag{21}$$

Multiply-divide circuit 203 is a circuit for dividing the inputs thereto and outputs $\Delta V_1 \times V_a / V_-$ for three inputs $\Delta V_1$, $V_-$ and $V_a$.

At the same time, from equations (2), (20), (21), the following equation holds for the potential difference V across the measurement element upon application thereto of a magnetic field H.

$$V_{out} = \Delta V_1 \times V_a / V_- = V_a \times (1 + H/|H_k|)/2 \tag{22}$$

where $|H_k|$ and $V_a$ are known values, and therefore, by determining the output voltage, the external magnetic field H can be determined.

$V_a$ can be set arbitrarily in such a manner as to determine the magnitude of the output voltage. In the process, a circuit is obtained in which assuming that the external magnetic field H changes from $-|H_k|$ to $|H_k|$, $V_{out}$ changes from 0 V to $V_a$.

Further, in the case where a positive output is required for a given direction of the external magnetic field, and a negative output for the opposite direction of the external magnetic field, an output regulation circuit 210 is added to subtract $V_a/4$ from this output. The internal circuit of output regulation circuit 210 is, for example, the differential amplifier circuit shown in FIG. 16 and connected to a constant voltage source 209 for subtraction. From equation (22), the following equation is obtained.

$$V_{out} = \Delta V_1 \times V_d / V_- V_a/4 = V_a \times (1/2 + H/|H_k|)/2 \tag{23}$$

As a result, a circuit is obtained in which assuming that the external magnetic field H changes from $-|H_k|$ to $|H_k|$, $V_{out}$ changes from $-V_a/2$ to $V_a/2$. More specifically, by setting $V_a$ to 2V, the output voltage is 1 V for $H=|H_k|$, and $-1$ V for the output voltage for $H=-|H_k|$.

The magnetic field detection circuit according to this embodiment includes a resistance-voltage conversion circuit for converting the resistance of the first reference magnetoresistive element, the resistance of the second reference magnetoresistive element and the resistance of the magnetic field detecting magnetoresistive element into voltages, an add-subtract amplifier circuit for amplifying the difference between the output voltages converted from the resistance of the first reference magnetoresistive element and the resistance of the magnetic field detecting magnetoresistive element in the resistance-voltage conversion circuit and the difference between the output voltages converted from the resistance of the first reference magnetoresistive element and the resistance of the second reference magnetoresistive element, and outputting them as first and second voltages, respectively, and a multiply-divide circuit for outputting the division of the first voltage and the second voltage as a third voltage.

As a result, differential detection is possible using the outputs of reference element 11 and detection element 1, and therefore a large output signal is obtained. Also, even in the case where the resistance change rate is changed under the effect of the resistance value change with temperature or the resistance variations between the elements, the change is automatically corrected using the resistance change rate in the actual operation environment of reference elements 11, 21, and therefore the external magnetic field can be accurately and instantaneously detected.

Further, the provision of the resistance-voltage conversion circuit, the add-subtract amplifier circuit and the multiply-divide circuit can configure a magnetic field detector having a simple circuit configuration and operated asynchronously.

Also, the resistance-voltage conversion circuit, the add-subtract amplifier circuit and the multiply-divide circuit are configured using a magnetoresistive element, a bipolar transistor and a resistor arranged on the same substrate, so that the effects of noises from external sources and the temperature change of the transistors and resistors included in the add-subtract amplifier circuit and the multiply-divide circuit can be suppressed.

The resistor used is preferably configured of a material such as a metal oxide film small in resistivity change with temperature.

Also, a magnetic shield 5 for shielding the external magnetic field can be arranged in reference elements 11, 21.

Magnetic shield 5 is formed of a similar material to the one in the first embodiment.

The provision of magnetic shield 5 keeps reference elements 11, 21 out of the effects of the external magnetic field.

As a result, as long as direction of magnetization 12 of the second ferromagnetic layer and direction of magnetization 13 of the first ferromagnetic layer in reference element 11 are parallel to each other while direction of magnetization 22 of the second ferromagnetic layer and direction of magnetization 23 of the first ferromagnetic layer in reference element 21 are antiparallel to each other, then directions of magnetization 12, 13 of the second ferromagnetic layers in reference elements 11, 21 can be set arbitrarily.

Incidentally, although three constant current sources are used in resistance-voltage conversion circuit 201 according to this embodiment, detection element 1 and reference elements 11, 21 may be connected in series to one power supply.

Also, the amplification factor of the add-subtract amplifier circuit shown in this embodiment is one example, and a configuration is of course possible in which different amplification factors are combined to produce the desired output.

Also, according to this embodiment, constant voltage sources 208, 209 are described as independent constant voltage sources to facilitate the understanding of the circuit diagram. Nevertheless, the external voltage such as Vcc may of course be divided by resistance.

Embodiment 12

Figure 21:
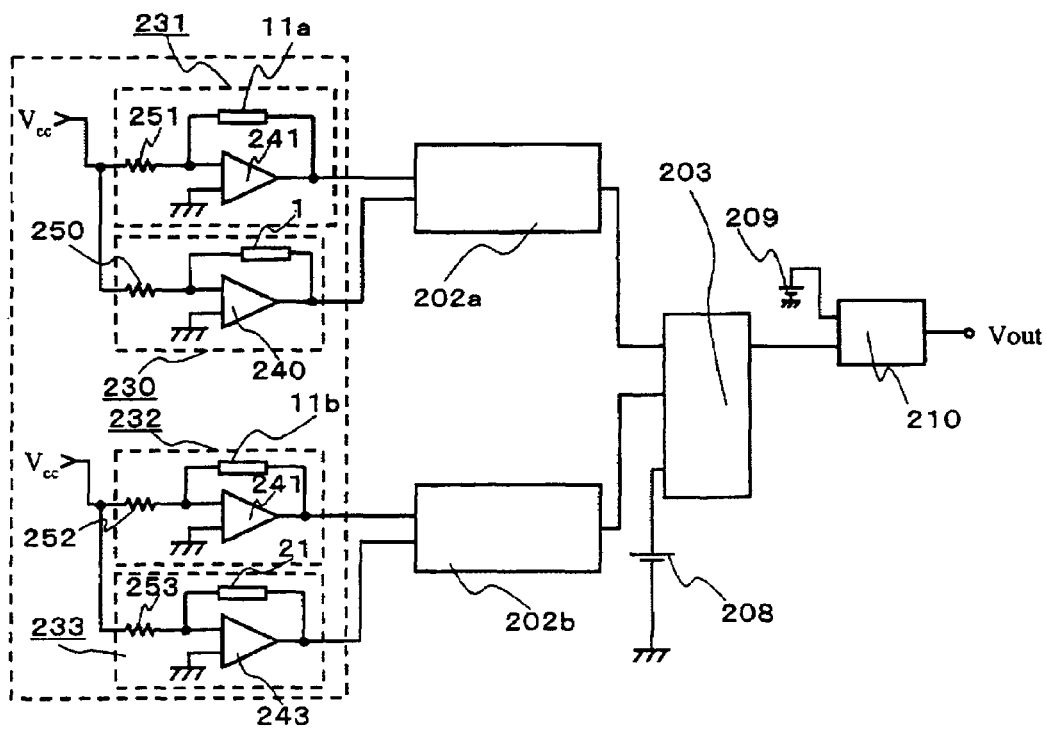
FIG. 21 is a diagram for describing the configuration of a magnetic field detector according to a twelfth embodiment.

The twelfth embodiment is a modification of the eleventh embodiment and includes two reference elements 11a, 11b in which the direction of magnetization of the first ferromagnetic layer and the direction of magnetization of the second ferromagnetic layer are parallel to each other and which have an equal external magnetic response characteristic, and reference element 21 in which the direction of magnetization of the first ferromagnetic layer and the direction of magnetization of the second ferromagnetic layer are antiparallel to each other and which has the same characteristic as reference element 11a. In this manner, a magnetic field detection circuit can be obtained by configuring a circuit as shown in FIG. 21 using three reference elements 11a, 11b, 21 and detection element 1.

This circuit configuration is described below. The magnetic field detection circuit according to this embodiment includes a resistance-voltage conversion circuit 201, add-subtract amplifier circuits 202a, 202b and a multiply-divide circuit 203.

Detection element 1, together with resistor 250 and OP amplifier 240, makes up an inverting amplifier circuit 230. An end of resistor 250 is connected to a constant voltage source (not shown). Reference elements 11a, 11b, 21 make up resistors 251, 252, 253, OP amplifiers 241, 242, 243 and inverting amplifier circuits 231, 232, 233, respectively. An end of each of resistors 251, 252, 253 is connected, like resistor 250, to a constant voltage source (not shown).

Resistance-voltage conversion circuit 201 includes inverting amplifier circuits 230, 231, 232, 233.

The outputs of inverting amplifier circuits 230, 231 are input to add-subtract circuit 202a. Also, the outputs of inverting amplifier circuits 232, 233 are input to add-subtract circuit 202b. Add-subtract circuits 202a, 202b are each the differential amplifier circuit, for example, shown in FIG. 16.

Add-subtract circuits 202a, 202b each output the difference between the outputs of inverting amplifier circuits 230, 231 and the outputs of inverting amplifier circuits 232, 233, respectively.

Next, the outputs of add-subtract circuits 202a, 202b are input to multiply-divide circuit 203. The configuration of add-subtract circuits 202a, 202b and multiply-divide circuit 203 is similar to that of the eleventh embodiment and therefore not described.

This circuit configuration includes an inverting amplifier circuit having detection element 1 and reference elements 11, 21 in place of the constant current circuit, and the element resistance change is detected and amplified in the form of a change in amplification factor of the constant voltage VCC supplied from a constant voltage source. More specifically, assuming that the resistance value of resistor 250 is $R_{22}$, the output voltage $V_{H1}$ of inverting amplifier circuit 230 using detection element 1 is given as $$V_{H1}=V_{cc}\times(R_m+\Delta R/2\times H/|H_k|)/R_{22} \quad (24)$$

Similarly, assuming that the resistance values of resistors 251, 252 are $R_{21}$, $R_{23}$, respectively, the output voltages $V_{H2}$, $V_{H3}$ of inverting amplifier circuits 231, 232 including reference elements 11a, 11b are given as $$V_{H2}=V_{cc}\times(R_m-\Delta R/2)/R_{21} \quad (25)$$

$$V_{H3}=V_{cc}\times(R_m-\Delta R/2)/R_{23} \quad (26)$$

Also, assuming that the resistance value of resistor 253 is $R_{24}$, the output voltage $V_{H4}$ of inverting amplifier circuit 233 including reference element 21 is given as $$V_{H4}=V_{cc}\times(R_m+\Delta R/2)/R_{24} \quad (27)$$

Reference elements 11a, 11b, 21 and detection element 1 have exactly the same configuration except for the directions of magnetization of the second ferromagnetic layer and the first ferromagnetic layer. Also, resistors 250, 251, 252, 253 desirably have the same resistance value to eliminate the output adjustment. Nevertheless, the output can be adjusted in subsequent stages in the case where resistance values are different.

Next, the add and subtract operation and amplification are carried out in add-subtract amplifier circuits 202a, 202b. The resistors used in add-subtract amplifier circuits 202a, 202b may have different resistance values. By using four resistors having exactly the same resistance value, however, the amplification factor can be set to unity. In this case, assuming that the resistance values of resistors 250, 251, 252, 253 are $R_{21}$ and equal to each other, the difference between the output voltages of the add-subtract circuit is given by equations (28), (29).

$$V_{H1}-V_{H2}=V_{cc}\times(1+H/|H_k|)\times\Delta R/R21/2 \quad (28)$$

$$V_{H4}-V_{H3}=V_{cc}\times\Delta R/R21 \quad (29)$$

Further, the output of multiply-divide circuit 203 is given by the equation below.

$$V_{out}=(V_{H1}-V_{H2})\times V_a/(V_{H4}-V_{H3})=V_a\times(1+H/|H_k|)/2 \quad (30)$$

Also, the provision of output regulation circuit 210 makes it possible to set the output range of $V_{out}$ at $-V_d/2$ to $V_d/2$ for H changing from $-|H_k|$ to $+|H_k|$.

The magnetic field measurement circuit according to this embodiment includes a resistance-voltage conversion circuit having a third reference magnetoresistive element of the same external magnetic field response characteristic as the first reference magnetoresistive element to convert the resistance of the first reference magnetoresistive element, the resistance of the second reference magnetoresistive element, the resistance of the third magnetoresistive element and the resistance of the magnetic field detecting magnetoresistive element into voltages, an add-subtract amplifier circuit for amplifying the difference between the voltages converted, by the resistance-voltage conversion circuit, from the resistance of the first reference magnetoresistive element and the resistance of the magnetic field detecting magnetoresistive element and the difference between the voltages converted, by the resistance-voltage conversion circuit, from the resistance of the second reference magnetoresistive element and the resistance of the third reference magnetoresistive element, and outputting a first voltage and a second voltage, and a multiply-divide circuit for outputting the division of the first voltage and the second voltage.

Due to the capability of differential detection using reference element 11 and detection element 1, a large output signal can be obtained. Also, even in the case where the resistance change rate is changed by the effect of the resistance value change due to the temperature and resistance value variations between the elements, the change is automatically corrected using the resistance change rate in an actual operating environment of reference elements 11, 21, and therefore the external magnetic field can be detected accurately and instantaneously.

Further, the provision of the resistance-voltage conversion circuit, the add-subtract amplifier circuit and the multiply-divide circuit can make up a magnetic field detector having a simple configuration operated asynchronously. Also, a configuration in which the resistance-voltage conversion circuit, the add-subtract amplifier circuit and the multiply-divide circuit are formed of a magnetoresistive element, a bipolar transistor and a resistor arranged on the same substrate makes it possible to suppress the effect of noises from external sources and the temperature change of the resistors and the transistors included in the add-subtract amplifier circuit and the multiply-divide circuit. The resistance is desirably provided by a resistor or the like of a material such as a metal oxide film small in resistivity change with temperature.

Further, detection is possible only with a constant voltage source without any constant current source, and therefore the circuit can be simplified.

Embodiment 13

Figure 22:
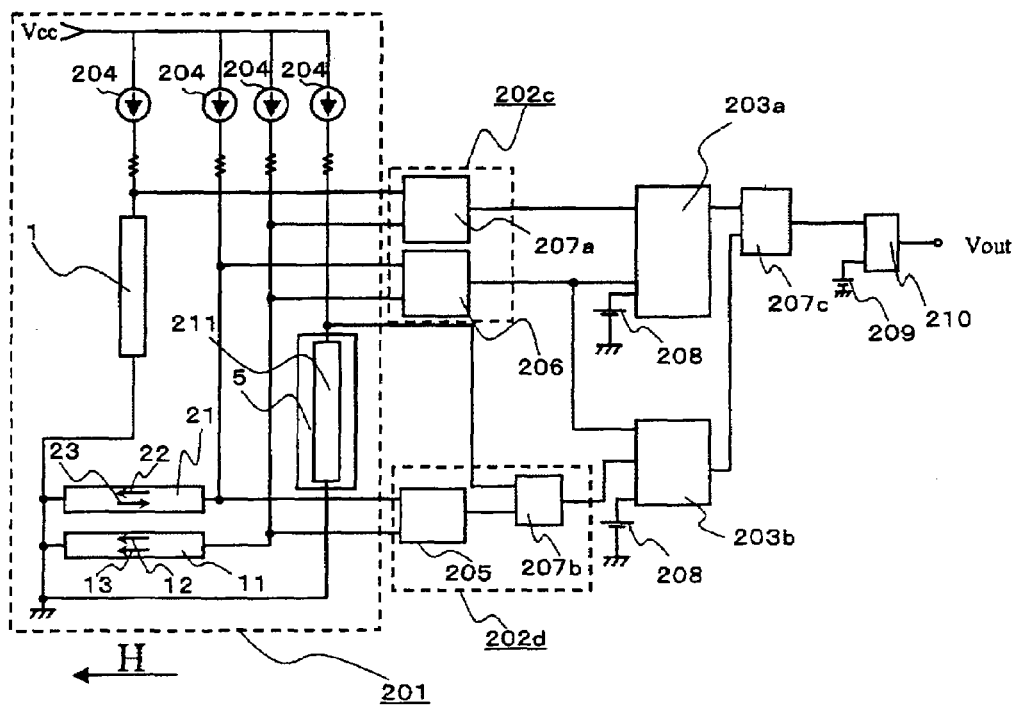
FIG. 22 is a diagram for describing the configuration of a magnetic field detector according to a thirteenth embodiment.

FIG. 22 is a circuit block diagram of a magnetic field detector according to a thirteenth embodiment of the present invention. The magnetic field detector shown here is an example of the circuit configuration in which the magnetic field detector according to the tenth embodiment further includes a calibration magnetoresistive element 211 (hereinafter referred to as the calibration element) having a magnetic field shield. The structure and the fabrication method of elements 1, 11, 21 included in the circuit are similar to those of the third embodiment and therefore not described again.

Figure 23:
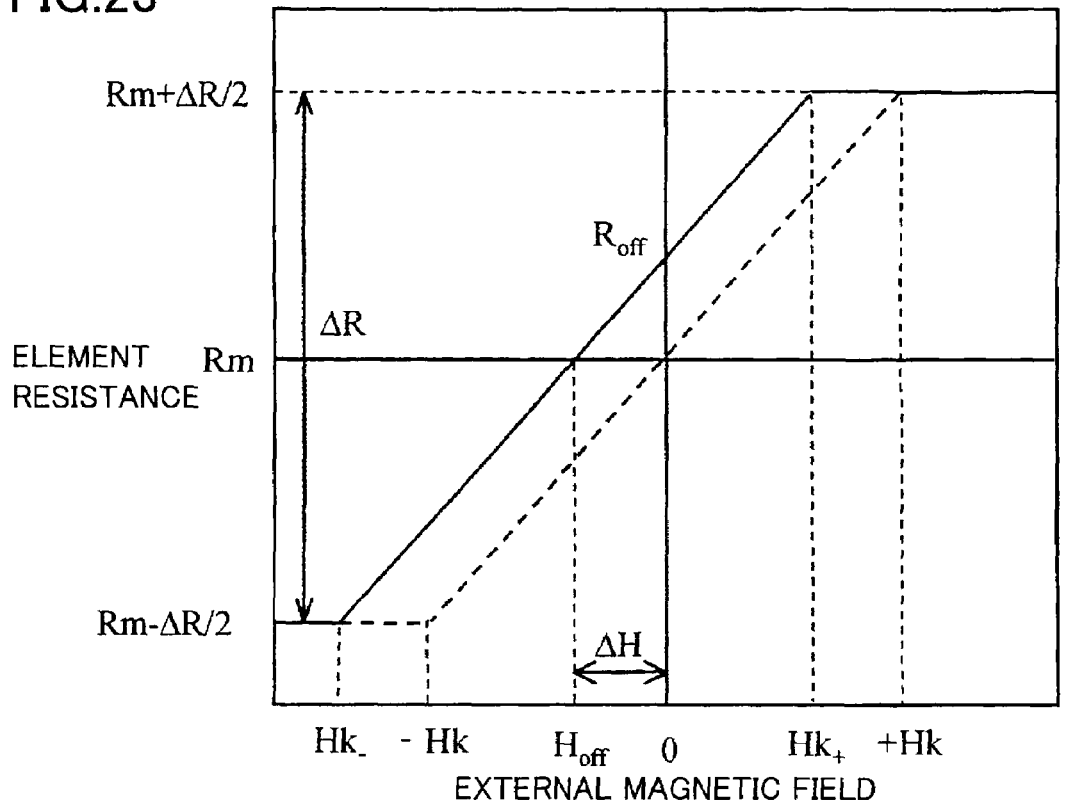
FIG. 23 is a diagram for describing the dependency of the element resistance of the magnetoresistive element on an external magnetic field.

First, calibration element 211 is described. Calibration element 211 is an element fabricated by the same method and having the same structure as detection element 1, which element further includes a magnetic shield 5. Magnetic shield 5 is formed of a similar material to that of the first embodiment. This configuration permits the resistance of an element to be determined accurately while no external magnetic field is applied. By accurately determining the resistance value in the absence of an external magnetic field applied, the external magnetic field can be measured with a higher accuracy. With reference to FIG. 23, this principle is described below.

With regard to the dependency of the element resistance on the external magnetic field, consider a case in which assuming that the resistance value for the external magnetic field of zero is $R_m$, the external magnetic field with $R=R_m$ develops a slight change ($\Delta H$) due to the environment and noises. In this case, the element resistance is $R=R_{offset}\neq R_m$ for zero external magnetic field. If measurement is conducted under this condition, as described in FIG. 23, the magnitude of the magnetic field detected develops an error of an amount of ΔH. Thus, the resistance value $R_{offset}$ with no external magnetic field applied is determined and the error corrected, with the result that a more accurate detection of the external magnetic field becomes possible. In the process, assume that the saturation magnetic fields with an external magnetic field applied in parallel and antiparallel to the direction of magnetization of the first ferromagnetic layer of reference element 211 are $H_{k+}$ and $H_{k-}$, respectively, and the voltage with a constant current I supplied to detection element 1 is $V_{offset}$. Since the inclination of the straight lines is the same, the equations below are obtained.

$$\Delta H/(H_{k+}-H_{k-})=(R_{offset}-R_m)/\Delta R \tag{31}$$

$$V_{offset}=IR_{offset} \tag{32}$$

where $H_{k+}-H_{k-}=2|H_k|$, and therefore, by determining $R_{offset}$, ΔR by measurement, a shift amount ΔH of the magnetic field resistance characteristic can be accurately determined from equation (31).

With reference to FIG. 22, the detect operation of the magnetic field detector according to this embodiment is described next. The magnetic field detector shown in FIG. 22 is configured of a resistance-voltage conversion circuit 201, add-subtract amplifier circuits 202c, 202d, multiply-divide circuits 203a, 203b and an add-subtract amplifier circuit 207c.

Resistance-voltage conversion circuit 201 is configured by connecting a constant current circuit 204 to detection element 1, reference elements 11, 21, calibration element 211, which are respectively supplied with a constant current I at the time of detecting a magnetic field. The operation of detection element 1 and reference elements 11, 21 is similar to the eleventh embodiment and not described again. Calibration element 211 has a structure covered by magnetic shield 5, and therefore the voltage $V_{offset}$ generated across it is equal to the voltage V of detection element 1 for zero external magnetic field.

Next, add-subtract amplifier circuit 202c is configured of a differential amplifier circuit 207a for amplifying the difference of the outputs between detection element 1 and reference element 11, and a subtract circuit 206 for calculating the difference between reference elements 11, 21. The detailed operation of differential amplifier circuit 207a and subtract circuit 206 is similar to that of the eleventh embodiment and not described again. Multiply-divide circuit 203a connected with differential amplifier circuit 207a and subtract circuit 206 has a similar configuration to that of the eleventh embodiment, and similarly to equation (23) in the eleventh embodiment, produces an output given as $$V_{out1}=(V-V_1)\times V_d/V_-=V_d\times\{1+2H/(H_{k+}-H_{k-})\}/2 \tag{33}$$

Figure 24:
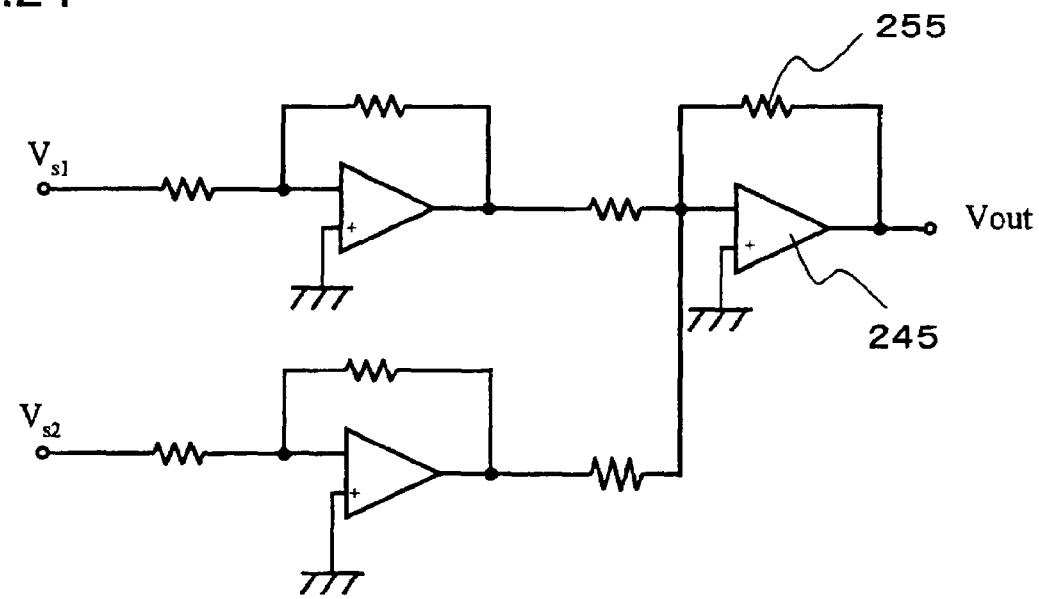
FIG. 24 is a circuit diagram for describing an example of an adder circuit.

Next, add-subtract amplifier circuit 202d includes an add circuit 205 for outputting the sum $V_+$ of the outputs of reference elements 11, 21, and a differential amplifier circuit 207b for amplifying the difference between the output of add circuit 205 and a value twice as large as $V_{offset}$. Add circuit 205 can be configured of the circuit as shown in FIG. 24, for example. The circuit shown in FIG. 24 is configured of OP amplifiers 245 and resistors 245. In this case, the same reference numerals in the drawing designate similar OP amplifiers and resistors.

In this case, the following equation for $V_+$ holds.

$$V_+=V_1+V_2=2\times I\times R_m \tag{34}$$

Differential amplifier circuit 207b amplifies the input from calibration element 211 having a magnetic shield to twice in magnitude and outputs the difference with the input from add circuit 205. The outputting voltage is given by equation (35) from equations (32) and (34).

$$(2\times V_{offset}-V_+)2\times I\times R_{offset}-2\times I\times R_m \tag{35}$$

Assuming that the output of constant voltage source 208 is $V_d/2$, the output of multiply-divide circuit 203b connected to add-subtract amplifier circuit 202d and subtract circuit 206 to produce the output of add-subtract amplifier circuit 202d divided by subtract circuit 206 is given from equations (21), (31), (35), as follows.

$$V_{out2}=V_d\times\Delta H/(H_{k+}-H_{k-}) \tag{36}$$

The output $V_{out}$ of add-subtract amplifier circuit 207c for outputting the difference of the outputs between multiply-divide circuit 203a and multiply-divide circuit 203b is given from equations (33), (36), as follows.

$$V_{out}=V_d\times\{1/2+(H-\Delta H)/(H_{k+}-H_{k-})\} \tag{37}$$

Further, subtracting $V_d/2$ using output regulation circuit 210, $$V_{out}=V_d\times\{(H-\Delta H)/(H_{k+}-H_{k-})\} \tag{38}$$

In other words, this magnetic field detector can exclude the error of a minor change (ΔH) of the external magnetic field associated with $R=R_m$.

Also, in the case where $V_d$ is set to 2 V, for example, the voltage output of 1 V to −1 V can be obtained between $H_{k+}$ and $H_{k-}$.

The magnetic field measurement device according to this embodiment includes a resistance-voltage conversion circuit having the same external magnetic field response characteristic as the magnetic field detecting magnetoresistive element and configured of a magnetically-shielded calibration magnetoresistive element for converting the resistance of the first reference magnetoresistive element, the resistance of the second reference magnetoresistive element, the resistance of the magnetic field detecting magnetoresistive element and the resistance of the calibration magnetoresistive element into voltages, a second add-subtract amplifier circuit for outputting, as a fourth voltage, the difference between the sum of the voltage converted by the resistance-voltage conversion circuit from the resistance of the first reference magnetoresistive element and the voltage converted by the resistance-voltage conversion circuit from the resistance of the second reference magnetoresistive element on the one hand and a voltage twice as high as the voltage converted from the resistance of the calibration magnetoresistive element on the other hand, a second multiply-divide circuit for outputting the difference between the second voltage and the fourth voltage as a fifth voltage, and a subtract circuit for outputting the difference between the third voltage and the fifth voltage.

As a result, the differential detection between the outputs of calibration element 211 and detection element 1 having a magnetic shield can be used, and therefore a large output signal can be obtained. Also, even in the case where the resistance change rate is changed under the effect of the change in resistance value due to temperature or variations of resistance between the elements, the change is automatically corrected using the resistance change rate in the environment of actual operation of calibration element 211 having the magnetic shield, and therefore the external magnetic field can be detected accurately and instantaneously.

Further, the provision of the resistance-voltage conversion circuit, the add-subtract amplifier circuit and the multiply-divide circuit can make up a magnetic field detector having a simple circuit configuration operated asynchronously.

Further, the resistance-voltage conversion circuit, the add-subtract amplifier circuit and the multiply-divide circuit are configured of a magnetoresistive element, a bipolar transistor and a resistor arranged on the same substrate, thereby making it possible to suppress the effect of noises from external sources and the temperature change of the transistors and the resistors included in the add-subtract amplifier circuit and the multiply-divide circuit. The resistance is desirably provided by a resistor formed of a material small in resistivity change with temperature such as a metal oxide film.

Further, the provision of calibration element 211 having the magnetic shield makes it possible to measure the external magnetic field more accurately by determining the resistance value $R_{offset}$ with no external magnetic field applied and using it as a reference value.

Also, reference elements 11, 21 can have a magnetic shield 5 for shielding the external magnetic field.

Magnetic shield 5 is formed of a similar material to that of the first embodiment.

The provision of magnetic shield 5 prevents reference elements 11, 21 from being affected by the external magnetic field. As a result, as long as direction of magnetization 12 of the second ferromagnetic layer and direction of magnetization 13 of the first ferromagnetic layer in reference element 11 are parallel to each other and direction of magnetization 22 of the second ferromagnetic layer and direction of magnetization 23 of the first ferromagnetic layer in reference element 21 are antiparallel to each other, directions of magnetization 12, 13 of the second ferromagnetic layers of reference elements 11, 21 can be set in an arbitrary direction.

The magnetic field detector and the current detection device, the position detection device and the rotation detector using the magnetic field detector are described above. The present invention is not limited to them, but applicable widely to other similar detectors including a detector of the position and movement amount of an object generating a magnetic field or moved while changing the magnetic field, a patterned magnetic element such as a magnetic storage device, a magnetic recording head or a magnetic recording medium, and a power detector or the like of which an object to be measured changes the magnetic field.

Also, the foregoing description concerns a magnetic field detector including three or four tunneling magnetoresistive elements. Nevertheless, the detector may include any other number of tunneling magnetoresistive elements. Further, these elements may form a bridge circuit, for example. Although a tunneling magnetoresistive element is desirably used, the present invention is not limited to it, but a giant magnetoresistive element or other magnetoresistive elements including a ferromagnetic layer with one direction of magnetization fixed.

The invention claimed is:

1. A magnetic field detector comprising a first magnetoresistive element and a second magnetoresistive element, the first magnetoresistive element and the second magnetoresistive element each having a stack structure including:
    an antiferromagnetic layer;
    a first layer of a ferromagnetic material with the direction of magnetization fixed by the antiferromagnetic layer;
    a nonmagnetic layer; and
    a second layer of a ferromagnetic material with the direction of magnetization adapted to be changed by an external magnetic field,
    wherein the second magnetoresistive element is such that the direction of magnetization of the first layer and the direction of magnetization of the second layer in a nonmagnetic field are different from each other, and
    wherein the direction of magnetization of the second layer in the nonmagnetic field of the first magnetoresistive element and the direction of magnetization of the second layer in the nonmagnetic field of the second magnetoresistive element are nonparallel or nonantiparallel to each other.

2. The magnetic field detector according to claim 1, wherein
    the direction of magnetization of the second layer in the nonmagnetic field of the first magnetoresistive element and the direction of magnetization of the second layer in the nonmagnetic field of the second magnetoresistive element are orthogonal to each other.

3. The magnetic field detector according to claim 1, wherein
    the first magnetoresistive element and the second magnetoresistive element have the same saturation value of a resistance with respect to the external magnetic field.

4. The magnetic field detector according to claim 1, wherein
    the first magnetoresistive element and the second magnetoresistive element produce an output signal by applying an electric current perpendicularly to the stack structure of the layers.

5. The magnetic field detector according to claim 4, wherein
    the first magnetoresistive element and the second magnetoresistive element have the same area.

6. The magnetic field detector according to claim 1, wherein the first magnetoresistive element is magnetically shielded.

7. A magnetic field detector comprising a first magnetoresistive element and a second magnetoresistive element, the first magnetoresistive element and the second magnetoresistive element each having a stack structure including:
    an antiferromagnetic layer;
    a first layer of a ferromagnetic material with the direction of magnetization fixed by the antiferromagnetic layer;
    a nonmagnetic layer; and
    a second layer of a ferromagnetic material with the direction of magnetization adapted to be changed by an external magnetic field,
    wherein the second magnetoresistive element is such that the direction of magnetization of the first layer and the direction of magnetization of the second layer in a nonmagnetic field are different from each other,
    wherein the magnetic field detector further comprises;
    a resistance-voltage conversion circuit for converting the resistance of the first magnetoresistive element and the resistance of the second magnetoresistive element into voltages; and
    an add-subtract amplifier circuit for amplifying the difference between the voltages converted from the resistance of the first magnetoresistive element and the resistance of the second magnetoresistive element by the resistance-voltage conversion circuit.

8. A current detection device using the magnetic field detector as set forth in claim 1.

9. A position detection device using the magnetic field detector as set forth in claim 1.

10. A rotation detection device using the magnetic field detector as set forth in claim 1.

11. A current detection device using the magnetic field detector as set forth in claim 7.

12. A position detection device using the magnetic field detector as set forth in claim 7.

13. A rotation detection device using the magnetic field detector as set forth in claim 7.

* * * * *